(12) United States Patent
Matsuda et al.

(10) Patent No.: US 7,897,868 B2
(45) Date of Patent: Mar. 1, 2011

(54) STACKED PHOTOVOLTAIC ELEMENT AND METHOD FOR PRODUCING THE SAME

(75) Inventors: Koichi Matsuda, Kyoto (JP); Makoto Higashikawa, Nara (JP); Tetsuro Nakamura, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 875 days.

(21) Appl. No.: 10/807,103

(22) Filed: Mar. 24, 2004

(65) Prior Publication Data

US 2004/0187914 A1    Sep. 30, 2004

(30) Foreign Application Priority Data

Mar. 26, 2003  (JP) ............... 2003-084535
Mar. 26, 2003  (JP) ............... 2003-084781
Mar. 12, 2004  (JP) ............... 2004-070794

(51) Int. Cl.
  *H01L 31/0392*  (2006.01)
  *H01L 31/0376*  (2006.01)

(52) U.S. Cl. ............. 136/258; 136/252; 136/256; 136/255; 136/261; 438/96; 438/97; 438/87

(58) Field of Classification Search .......... 136/246, 136/258, 252, 256, 255, 251
See application file for complete search history.

(56) References Cited

U.S. PATENT DOCUMENTS

| | | | |
|---|---|---|---|
| 4,612,411 A | 9/1986 | Wieting et al. | 136/265 |
| 5,021,100 A | 6/1991 | Ishihara et al. | 136/249 |
| 6,180,870 B1 | 1/2001 | Sano et al. | 136/258 |
| 6,426,547 B1 | 7/2002 | Greenberg et al. | 257/656 |
| 6,468,885 B1 * | 10/2002 | Mahan et al. | 438/482 |
| 6,787,069 B1 * | 9/2004 | Kohiki et al. | 252/518.1 |
| 7,189,917 B2 * | 3/2007 | Okada et al. | 136/255 |

FOREIGN PATENT DOCUMENTS

| | | |
|---|---|---|
| CN | 1175095 A | 3/1998 |
| JP | 63-77167 | 4/1988 |
| JP | 2-237172 | 9/1990 |
| JP | 2000-150934 | * 3/2000 |
| JP | 2000150934 A * | 5/2000 |
| JP | 2001-308354 | 11/2001 |
| JP | 2003188401 | 7/2003 |
| JP | 2003188401 A * | 7/2003 |

OTHER PUBLICATIONS

T. Minami, H. Nanto and S. Takata, "Highly conductive and transparent zinc oxide films prepared by rf magnetron sputtering under an applied external magnetic field", Applied Physics Letters 41, 958-960 (1982).*

(Continued)

*Primary Examiner*—Jennifer K Michener
*Assistant Examiner*—Jayne Mershon
(74) *Attorney, Agent, or Firm*—Fitzpatrick, Cella, Harper & Scinto

(57) ABSTRACT

A stacked photovoltaic element comprising a plurality of unit photovoltaic elements each composed of a pn- or pin-junction, connected to each other in series, wherein a zinc oxide layer is provided at least one position between the unit photovoltaic elements, and the zinc oxide layer has resitivity varying in the thickness direction.

10 Claims, 7 Drawing Sheets

OTHER PUBLICATIONS

K. Von Rottkay, M. Rubin, N. Ozer, "Optical Indices of Tin-Doped Indium Oxide and Tungsten Oxide Electrochromic Coatings", Mater. Res. Soc. Symp. Proc. 403, 551-556. (1995).*

R. A. Rabadanov, M. K. Guseikhanov, I. Sh. Aliev and S. A. Semiletov, "Properties of metal-zinc oxide contacts", Izvestiya Vysshikh Uchebnykh Zavedenii, Fizika, 6, 72-75 (1981).*

C. Agashe, O. Kluth,. G. Schöpe, H. Siekmann, J. Hüpkes and B. Rech "Optimization Of The Electrical Properties Of Magnetron Sputtered Aluminium Doped Zinc Oxide Films For Opto-Electronic Applications" Proceedings of the 4th International Conference on Coatings on Glass : Braunschweig, Germany.—2002.—S. 5.*

M.A. Martinez, J. Herrero, M.T. Gutierrez, "Optimisation of indium tin oxide thin films for photovoltaic applications", Thin Solid Films 269, 80-84 ( 1995).*

English Translation of JP 2000-150934, Nakajima et al, May 2005.*

K. Yamamoto, "Thin-film Polycrystalline Silicon Solar Cell", Applied Physics, The Japan Society of Applied Physics, May 2002, vol. 71, No. 5, pp. 522-527 (English translation).

K. Yamamoto, "Thin-film Polycrystalline Silicon Solar Cell", Applied Physics, The Japan Society of Applied Physics, May 2002, vol. 71, No. 5, pp. 522-527 (with handwritten English translation of text shown in drawings).

* cited by examiner

STACKED PHOTOVOLTAIC ELEMENT AND METHOD FOR PRODUCING THE SAME

BACKGROUND OF THE INVENTION

1. Field of the Invention

The present invention relates to a stacked photovoltaic element comprising at least two power-generating function units, and a method for producing the same.

2. Related Background Art

A photovoltaic element is a device which converts incident light energy into electric energy. A solar cell is a photovoltaic element which converts solar rays as white light into electric energy. It is characterized by efficiently converting light over a wide wavelength range into electric energy. It is necessary to efficiently absorb light over a wide wavelength range in order to achieve a high conversion efficiency.

A stacked photovoltaic element, which is formed by stacking a plurality of photovoltaic elements each containing a photoactive layer having a different band gap from each other is known as one of the solutions to achieve a high conversion efficiency. This stacked photovoltaic element has one photovoltaic element having a photoactive layer of larger band gap on a light incident side or thinner photoactive layer, and another photovoltaic element having a semiconductor of smaller band gap or thicker photoactive layer in this order from the light incident side, the former absorbing light of shorter wavelengths and the latter absorbing light of longer wavelengths which the former transmits. The stacked photovoltaic element, therefore, can more efficiently absorb and utilize light over a wider wavelength range.

It is essential to provide each photovoltaic element having a photoactive layer having a different band gap with light of a wavelength in a range suitable for that element, because a wavelength range of incident light which each photovoltaic element can utilize varies depending on the band gap of a semiconductor used as the photoactive layer for that element. In other words, photon cannot be absorbed by the semiconductor when photon has lower energy than the band gap of the semiconductor. In such a case, it only passes through the semiconductor without being utilized. On the other hand, photon having higher energy than the band gap of the semiconductor cannot be fully utilized although it can be absorbed, because potential energy of electron which can be produced when the electron is excited is limited by magnitude of the band gap, whereby the difference between the band gap energy and photon energy cannot be utilized. It is therefore essential to design a stacked photovoltaic element to selectively introduce light of shorter wavelength range into a photovoltaic element on the incident light side and light of longer wavelength range into another photovoltaic element arranged under the above element.

One of the known solutions is to provide an intermediate layer as a light-reflecting layer between these photovoltaic elements. For example, Japanese Patent Application Laid-Open No. S63-77167 and Kenji Yamamoto, "Thin-film polycrystalline silicon solar cell", Applied Physics, The Japan Society of Applied Physics, May, 2002, Vol. 71, No. 5, p. 524 to 527 disclose a method for providing an electroconductive intermediate layer each between the elements which reflects light of shorter wavelength and transmit light of longer wavelength. Japanese Patent Application Laid-Open No. H2-237172 discloses a method for adjusting the thickness of a selective reflection layer in such a way to increase electric current flowing through a photovoltaic element on the incident light side by setting its peak reflectivity to the maximum wavelength of spectral sensitivity of the photovoltaic element on the incident light side. Japanese Patent Application Laid-Open No. 2001-308354 discloses a method for enhancing efficiency of a stacked photovoltaic element by a selective reflection layer of stacked structure having a higher reflectivity for the shorter wavelength range which the upper photoelectron conversion layer can absorb more easily, and a lower reflectivity for the longer wavelength range which the lower photoelectron conversion layer can absorb more easily for transmission. Each of these techniques uses a dielectric layer of $SnO_2$, ZnO, ITO or the like as the selective reflection layer, to prevent light of short wavelength, which should be absorbed by the photovoltaic element on the incident light side, from being absorbed by the lower photovoltaic element and thereby to enhance conversion efficiency of the photovoltaic element on the incident light side.

As discussed above, the extensive studies on intermediate layers have produced the intermediate layers good to some extent. However, there are problems to be solved to satisfy the demands for improved optical and electrical characteristics, compatibility with a semiconductor layer, and deposition rate.

For example, the following problems occur when the above-described electroconductive reflection layer is provided as the intermediate layer.

A photovoltaic element of large area, comprising unit elements stacked on each other in series, e.g., as shown in FIG. 1, has electrical defects within the element, resulting from dust generated during the deposition step, or irregularities or foreign matter on the surface of a substrate. In FIG. 1, numeral 100 denotes the stacked photovoltaic element; 101: substrate, 102: second photovoltaic element, 103: zinc oxide layer, 104: first photovoltaic element, 105: electroconductive layer as transparent electrode, 106: short circuit in the second photovoltaic element, and 107: short circuit in the first photovoltaic element. The electrical defects inevitably associated with the large area deteriorate the element characteristics resulting from decreased shunt resistance and fill factor (FF). One of the effective means to solve these problems is a method (passivation) in which a photovoltaic element is normally dipped in an electrolytic solution and an electric current is passed through it to selectively remove a part of an electroconductive layer outside of an electric defect. However, for a stacked photovoltaic element comprising a lower photovoltaic element layer, an intermediate layer, an upper photovoltaic element layer and an electroconductive layer on a substrate, the above procedure can partly remove the electroconductive layer 105 on the first photovoltaic element layer as the upper layer containing the defect 107, but cannot remove the intermediate layer 103 on the second photovoltaic element layer as the lower layer containing the defect 106. As a result, short-circuit current flows through the defect in the lower layer to decrease electromotive force of the lower photovoltaic element. Short-circuit current cannot be effectively prevented from spreading into the intermediate layer for various reasons. In particular the intermediate layer should have a certain thickness to function as the reflection layer, and should satisfy the other considerations, e.g., compatibility with the semiconductor layers with which it is in contact on both sides and series resistance. These requirements limit a range in which the resistivity of the materials can be adjusted. Moreover, additional junctions generated between the photovoltaic elements and an intermediate layer of a different material therebetween inevitably deteriorate characteristics which are accompanied by decreased FF. Still more, a plurality of layers inserted to prevent a reduced shunt resistance further increase junction number, thus further aggravating the interfacial problems.

As discussed above, incorporation of an intermediate layer as a selective reflection layer for increasing photocurrent involves the adverse effect of decreased electromotive force of the photovoltaic element.

Moreover, the method disclosed by Patent Document 3, although giving a selective reflection layer structure satisfying the light reflection and light transmission characteristics, is found to be still insufficient in producing the intermediate layer having no adverse effect on the photovoltaic element and having good connection with the photovoltaic element. For the intermediate layer to have sufficient characteristics, the following technical requirements should be satisfied.

The intermediate layer should be kept in good ohmic contact with the semiconductor layer under the intermediate layer. It should be formed in such a way to cause little damages to the underlaying semiconductor layer by chemical modification (e.g., by oxidation) or physical modification (e.g., by ion-caused damages). Moreover, it should have an adequate resistivity and film thickness, and should be designed to control lateral flow of shunt current via the intermediate layer.

SUMMARY OF THE INVENTION

It is an object of the present invention to provide a stacked photovoltaic element exhibiting a high conversion efficiency realized by producing large photocurrent without causing decreased electromotive force in consideration of the above problems.

It is another object of the present invention to provide a stacked photovoltaic element of high conversion efficiency, capable of efficiently collecting energy over an entire wavelength range of incident light, and having good open-circuit voltage (Voc) and fill factor (FF), among others. It is still another object of the present invention to provide a method for producing the same.

The present invention has been accomplished by the extensive studies to solve the above problems, and has the following constitutions.

The first aspect of the present invention is a stacked photovoltaic element comprising a plurality of unit photovoltaic elements each composed of a pn- or pin-junction, connected to each other in series, wherein at least a zinc oxide layer is provided at least one position between the unit photovoltaic elements, and the zinc oxide layer has resitivity varying in the thickness direction.

In the first aspect, zinc oxide on a side of being in contact with a p-layer of the pn- or pin-junction has a higher resistivity than that on a side of being in contact with an n-layer of the pn- or pin-junction in the zinc oxide layer.

In the first aspect, the resistivity of zinc oxide continuously decreases from the p-layer side towards the n-layer side.

In the first aspect, the resitivity of zinc oxide is preferably $2 \times 10^0$ $\Omega$cm or more but $5 \times 10^3$ $\Omega$cm or less.

In the first aspect, the highest resistant portion of zinc oxide preferably has $5 \times 10^2$ $\Omega$cm or more but $5 \times 10^3$ $\Omega$cm or less.

Of the plurality of the unit photovoltaic elements for the first aspect, at least one unit photovoltaic element has a pin-junction comprising an i-type layer suitably composed of an amorphous Si:H.

Of the plurality of the unit photovoltaic elements for the first aspect, at least one unit photovoltaic element has a pin-junction comprising an i-type layer suitably composed of microcrystalline Si.

Of the plurality of the unit photovoltaic elements for the first aspect, at least one unit photovoltaic element has a pin-junction comprising an i-type layer suitably composed of single-crystalline or poly-crystalline Si.

The second aspect of the present invention is a method for producing a stacked photovoltaic element comprising an intermediate layer between unit photovoltaic elements each having a pn- or pin-junction, wherein a first layer mainly composed of indium oxide is stacked on at least one interface with the photovoltaic element and then a second layer mainly composed of zinc oxide is stacked on the first layer to form the intermediate layer.

In the method of the second aspect, the second layer is formed to be thicker than the first layer.

In the method of the second aspect, the first layer is formed to have a thickness of 1 nm or more but 50 nm or less.

In the method of the second aspect, the second layer is formed at a rate higher than that of the first layer.

In the method of the second aspect, the second layer is formed at a temperature lower than that of the first layer.

The third aspect of the present invention is a stacked photovoltaic element comprising an intermediate layer between unit photovoltaic elements each having a pn- or pin-junction, wherein the intermediate layer comprises a first layer and a second layer stacked in this order on at least one interface with a photovoltaic element, the first layer being mainly composed of indium oxide and the second layer being mainly composed of zinc oxide.

In the third aspect, the second layer is thicker than the first layer.

In the third aspect, the first layer has a thickness of 1 nm or more but 50 nm or less.

In the third aspect, the second layer has a transmittance higher than that of the first layer at a wavelength of 800 nm.

The first aspect of the present invention can provide a stacked photovoltaic element exhibiting a high conversion efficiency realized by efficiently absorbing light over an entire wavelength range of incident light, reducing short-circuit current flowing an electrical defect and improving juncture between the zinc oxide layer and semiconductor layer.

The second aspect and third aspect brings excellent effects, the former providing a method for producing a stacked photovoltaic element and the latter providing a stacked photovoltaic element, where the stacked photovoltaic element is of high conversion efficiency, can efficiently collect energy over an entire wavelength range of incident light, and has good open-circuit voltage (Voc) and fill factor (FF).

DESCRIPTION OF THE PREFERRED EMBODIMENTS

The preferred embodiments of the present invention are described by referring to the attached drawings. It should be understood that the present invention is not limited to these embodiments.

A solar cell comprising two photovoltaic elements will be described as an example of the stacked photovoltaic element of the present invention. However, the present invention is not limited to this structure, and can be applied to a stacked photovoltaic element comprising three or more photovoltaic elements.

Figure 3:
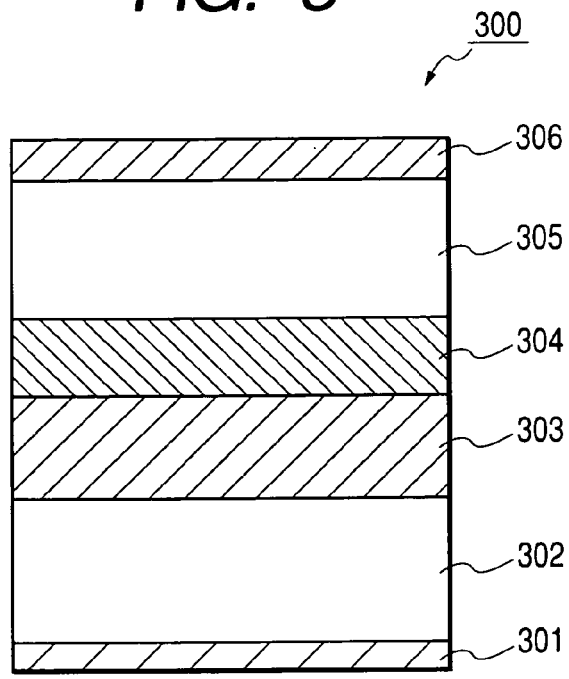
FIG. 3 is a schematic cross-sectional view showing the structure of one embodiment of the stacked photovoltaic element of the present invention.

FIG. 3 outlines a cross-sectional structure of the two-layers-stacked photovoltaic element 300 as one embodiment of the present invention. It has on a substrate 301 of a metal or the like which has a reflection layer stacked thereon, the second photovoltaic element 302, second zinc oxide layer 303, first zinc oxide layer 304, first photovoltaic element 305 and transparent electrode 306 stacked in this order. A semiconductor which constitutes the photoactive section for the first photovoltaic element 305 has a larger band gap than that of a semiconductor which constitutes the photoactive section for the second photovoltaic element 302. This means that the stacked photovoltaic element 300 is designed in such a way that the first photovoltaic element 305 absorbs light in a short wavelength range while the second photovoltaic element 302 absorbs light in a long wavelength range. The first zinc oxide layer 304 and first photovoltaic element 305 have a different refractive index. Therefore, multiple reflection can be created by adjusting the thickness of each layer to efficiently enhance reflectivity in the short wavelength range, and thereby to increase the quantity of light absorbed by the first photovoltaic element 305. The second zinc oxide layer 303 is designed to have a higher resistivity than that of the first zinc oxide layer 304.

Figure 4:
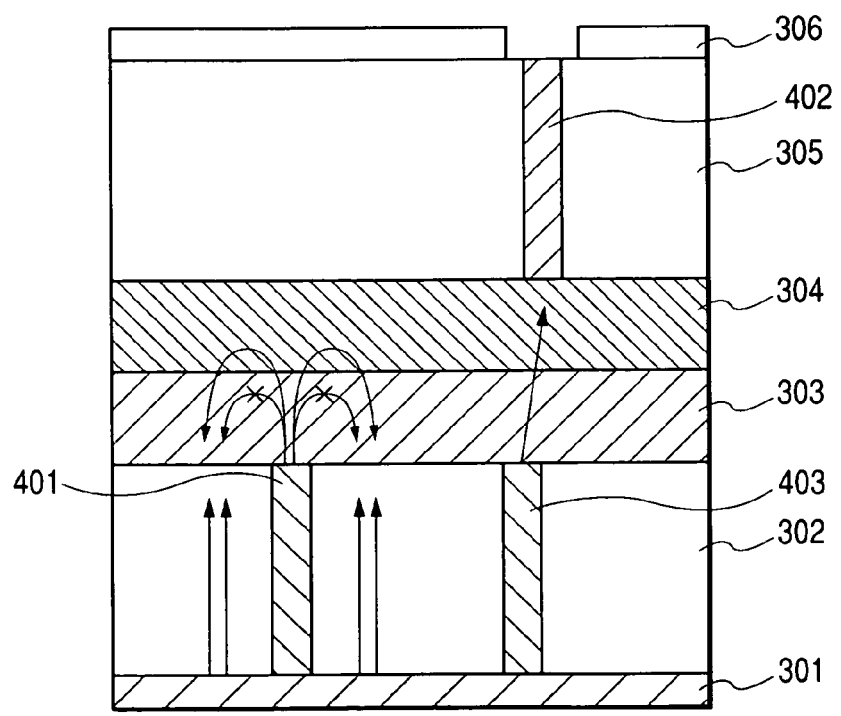
FIG. 4 is a schematic cross-sectional view showing the power-generating operation of the stacked photovoltaic element of the present invention.

FIG. 4 schematically illustrates power-generating operation of the first stacked photovoltaic element of the present invention. An electrical defect in the first photovoltaic element acts as a short-circuit to current passage. When the electrical defect 402 in the first photovoltaic element 305 is close to the electrical defect 403 in the second photovoltaic element 302, no deterioration of the photovoltaic element characteristics is caused by these defects, because the transparent electrode 306 is removed by the shunt passivation treatment carried out after the stacked photovoltaic element is assembled. When these defects are apart from each other at a distance, on the other hand, the characteristics may be deteriorated, because of insufficient shunt passivation treatment. Although the first photovoltaic element 305 is provided with the first zinc oxide layer 304 of lower resistivity on the substrate side surface, the layer is thin enough to limit lateral spreading of short-circuit currents. Therefore, it causes only minor deterioration of the photovoltaic element characteristics.

On the other hand, in the vicinity of the electrical defect in the second photovoltaic element 302, the electroconductive zinc oxide layer is present, and the defect acts as a short circuit in the photovoltaic element while power is being generated. However, the second photovoltaic element 302 has the second zinc oxide layer 303 of higher resistivity on the surface of the element 302 (upper layer surface), whereby short-circuit current spreads via the first zinc oxide layer 304 of lower resistivity while its spread in the lateral direction is limited. A total thickness of the first zinc oxide layer 304 and second zinc oxide layer 303 is limited to a level suitable for the selective reflection layer, and spread of the short-circuit current can be efficiently prevented by combination of the higher and lower resistivities.

Figure 1:
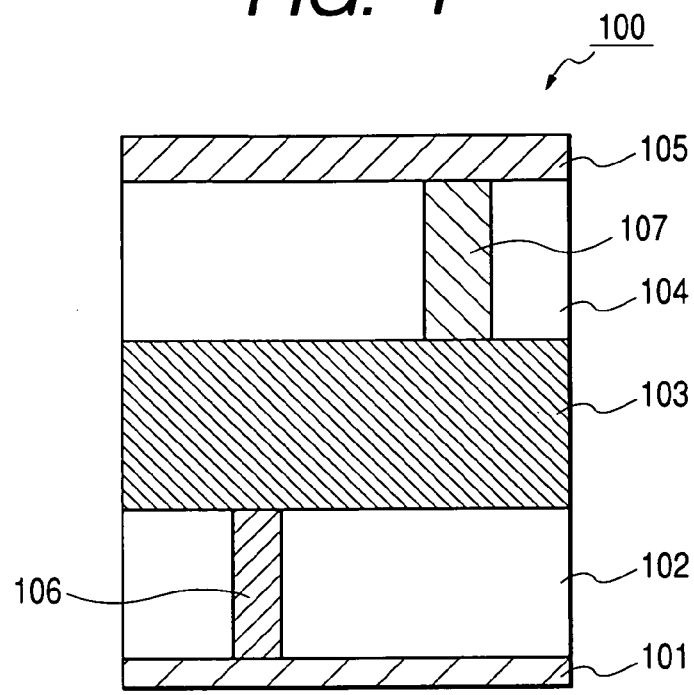
FIG. 1 is a schematic cross-sectional view showing the structure of a conventional photovoltaic element provided with a zinc oxide layer.
Figure 2:
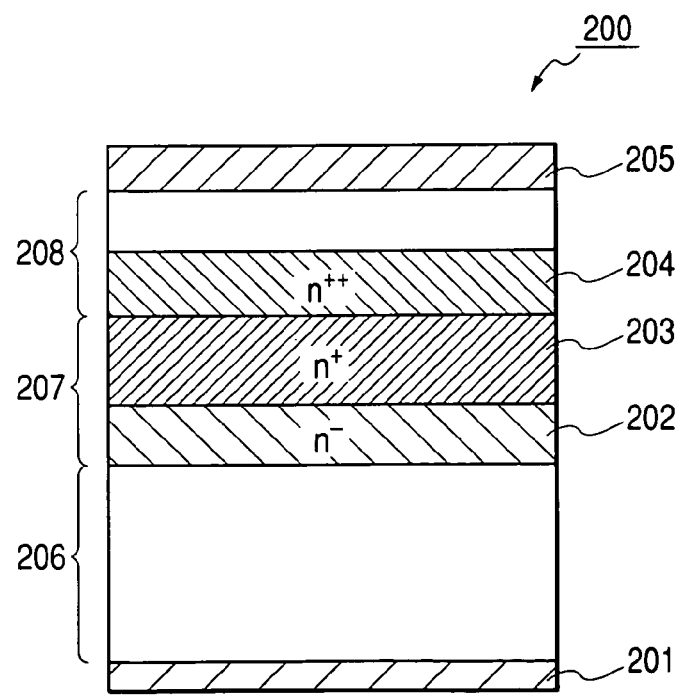
FIG. 2 is a schematic cross-sectional view showing the electrical polarities of a part of one embodiment of the stacked photovoltaic element of the present invention.

The electrical polarities at each junction of the stacked structure consisting of the second photovoltaic element, second and first zinc oxide layer and first photovoltaic element provided in this order are, for example, as shown in FIG. 2, a combination of n−/n+/n++, i.e., the second zinc oxide layer 202 of the lowest carrier concentration (n−), the first zinc oxide layer 203 of higher carrier concentration (n+) and the n-type semiconductor layer 204 of the first photovoltaic element of the highest carrier concentration (n++) are stacked in this order. In FIG. 2, 201 denotes a substrate, 202: second zinc oxide layer of n-type, 203: first zinc oxide layer of n+type, 204: first photovoltaic element as the n−type semiconductor layer of n++type, 205: transparent electrode, 206: second photovoltaic element, 207: stacked zinc oxide layer, and 208: first photovoltaic element.

The n−type zinc oxide layer can have a controlled bulk carrier concentration by the production conditions. It is considered that light-generating carrier can be collected more efficiently by increasing carrier concentration in the n-type zinc oxide layer stepwise or continuously from the p-type semiconductor layer side of the second photovoltaic element towards the n−type semiconductor layer side of the first photovoltaic element, because increasing or decreasing trend of concentration of the carrier of the same polarity is set in one direction including the n−type semiconductor layer of the first photovoltaic element, thereby efficiently connecting these elements to each other at the band junction, although the concept is not fully substantiated.

The zinc oxide layer as the intermediate layer has a higher resitivity, preferably $2 \times 10^0$ Ωcm or more but $5 \times 10^3$ Ωcm or less for both the first and second zinc oxide layers, than recent zinc oxide layers of which the resitivity has been greatly decreased. The intermediate layer having a resistivity in the above range has a lower carrier concentration than that of the n−type semiconductor layer of the first photovoltaic element, conceivably resulting in improved junction. On the other hand, short-circuit current is considered to diffuse in the zinc oxide layer, unless zinc oxide has a resistivity of $5 \times 10^2$ Ωcm or more but $5 \times 10^3$ Ωcm or less in the high-resistivity portion, to deteriorate the characteristics.

The zinc oxide layer preferably transmits at least 50% of light having a wavelength of 800 nm. The wavelength range of solar light which can be effectively utilized by the photovoltaic element is approximately from 300 to 1200 nm in consideration of its spectral pattern. The photovoltaic element on the zinc oxide layer absorbs light of short wavelength, and hence it is preferable for the zinc oxide layer to effectively transmit light of long wavelength. Therefore, it preferably transmits at least 50% of light having a wavelength of 800 nm, which represents the long wavelength.

The stacked photovoltaic elements of the second and third aspects of the present invention will be now described.

First, the intermediate layer as the feature of these aspects is described. In each of these aspects, a stacked photovoltaic element is formed by stacking a plurality of unit photovoltaic elements each containing a pn- or pin-junction, wherein a first layer mainly composed of indium oxide is stacked on at least one interface with a photovoltaic element and then a second layer mainly composed of zinc oxide is stacked on the first layer to form the intermediate layer. The stacked photovoltaic element of the above structure brings the following effects. The structure and each component of the stacked photovoltaic element of each aspect will be described in detail later.

Incorporation of the intermediate layer of the above structure can prevent deterioration of the Voc and FF values, and allows the stacked photovoltaic element to exhibit the excellent characteristics for extended periods of use. The Voc and FF values tend to deteriorate, when an intermediate layer of zinc oxide alone is provided on the interface with the photovoltaic element, while depending on conditions under which zinc oxide is produced, its resitivity and thickness, among others. This phenomenon is not notably observed when a photovoltaic element is provided on zinc oxide. For example, zinc oxide may be used for a reflection layer to be provided on a substrate type photovoltaic element. In such a case, deterioration of the Voc or FF characteristics is not observed notably, from which it is considered that the deteriorated characteristics result from the process itself for forming the zinc oxide layer on the interface with the photovoltaic element. In other words, it is conceivably related to the process in which the semiconductor is formed on zinc oxide in a reducing atmosphere whereas zinc oxide is formed on the interface with the photovoltaic element in an oxidative atmosphere: oxygen in zinc oxide formed on the interface with the photovoltaic element is depleted by the atom on the interface with the photovoltaic element to oxidize the semiconductor, resulting in formation of a modified layer in the interface between the photovoltaic element and zinc oxide.

The above tendency is more noted when the zinc oxide layer is formed in the presence of oxygen or moisture. Its characteristics are further deteriorated when the film formed by sputtering or the like, which generates the oxygen ion, because of the ion-caused damages to the interface with the photovoltaic element. The phenomenon is still more noted when the zinc oxide layer is formed on a p-type layer, which is more sensitive to the Voc characteristics.

When an intermediate layer composed mainly of indium oxide is provided on the interface with the photovoltaic element, on the other hand, shunt resistance tends to decrease to deteriorate the Voc and FF values depending on conditions under which zinc oxide is produced, content of a dopant, e.g., tin, its resitivity and thickness, among others. The decreased shunt resistance conceivably results from generation of leakage current flowing in the intermediate layer in the lateral direction, because indium oxide generally has a lower resistivity than that of zinc oxide. Moreover, indium oxide is more sensitive to a reducing atmosphere than zinc oxide, and indium separates out when a photovoltaic element is formed on indium oxide, thereby deteriorating the characteristics, including long-term reliability.

No deterioration of the characteristics, in particular Voc and FF, is observed, when a thin, first layer mainly composed of indium oxide and then second layer mainly composed of zinc oxide are stacked on the interface with the photovoltaic element to form the intermediate layer. This conceivably results from the improved interface between the first layer and photovoltaic element, although not fully substantiated. It is expected that flowing of leakage current in the lateral direction can be made difficult when the first layer has an adequate resistivity and thickness, and photocurrent can be increased when the second layer is adequately thick.

The first layer preferably has a sufficient resistivity so as to make difficult the flowing of leakage current in the lateral direction and is adequately thin. The photovoltaic element is attached frequently at high temperature, and indium can diffuse when exposed to high temperature continuously for extended periods to deteriorate the characteristics including long-term reliability. It is preferable, also viewed from the above, the first layer is adequately thin. Therefore, the first layer mainly composed of indium oxide preferably has a thickness of 1 nm or more but 50 nm or less, more preferably 3 nm or more but 40 nm or less, still more preferably 5 nm or more but 30 nm or less.

The intermediate layer, on the other hand, reflects more light to the photovoltaic element provided thereon as its thickness increases. Therefore, the second layer is preferably thicker than the first layer.

The first layer preferably has a lower resistivity than the second layer. Each layer preferably has an average transmittance of 80% or more for the visible light, in particular the transmittance of 80% or more at a wavelength of 800 nm (light of long wavelength side). Moreover, the second layer preferably has a higher transmittance at a wavelength of 800 nm than the first layer.

As discussed above, the second and third aspects of the present invention are characterized by the optimum design in which at least two oxide films of different characteristics are functionally separated from each other in accordance with the characteristics of each film.

The intermediate layer has a certain thickness. The increase of a deposition rate is economically advantageous because of decreased tact time, but is liable to deteriorate the characteristics. Formation of the first layer at a lower rate can secure the good interfacial characteristics while minimizing the damages. No deterioration of the characteristics is observed, when the first layer is formed at a lower rate and then the second layer at a higher rate. Therefore, the second layer is preferably formed at a higher rate than the first layer.

Moreover, indium tends to diffuse, and hence the intermediate layer is preferably formed at as low temperature as possible after the first layer is formed. It should be noted, however, that decreasing deposition temperature tends to deteriorate the transmittance of indium oxide. Therefore, a certain temperature level is essential for forming the indium oxide layer. The zinc oxide layer, on the other hand, tends to have a higher transmittance to have the enhanced Jsc value, when formed at lower temperature. Increasing deposition temperature, however, generates more stress in the zinc oxide layer, tending to cause separation of the stacked structure at the intermediate layer. Therefore, the second layer is preferably formed at a lower temperature than the first layer. The first layer is preferably formed at 150° C. or higher but 300° C. or lower, and the second layer at 50° C. or higher but 250° C. or lower. Moreover, the second layer is more preferably formed at a temperature lower by at least 40° C.

Next, the construction of the stacked photovoltaic element of the second and third aspect of the present invention will be described.

Figure 8:
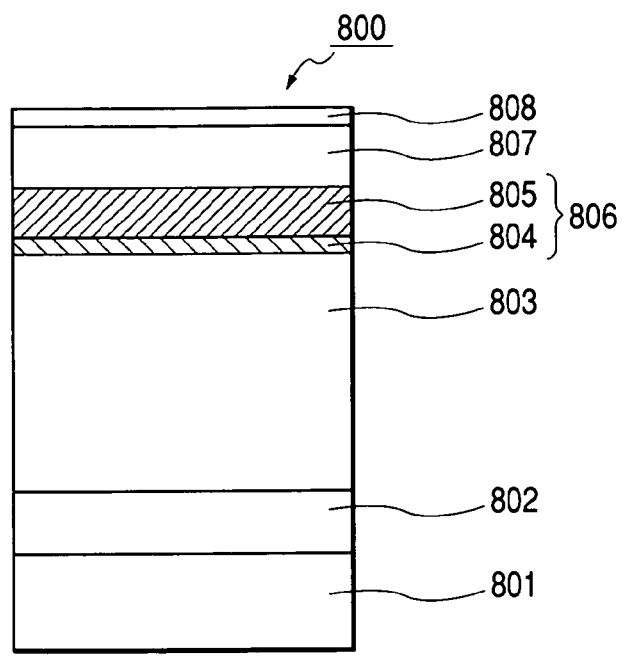
FIG. 8 is a schematic cross-sectional view showing the structure of one embodiment of the stacked photovoltaic element of the present invention.

FIG. 8 schematically outlines a cross-sectional structure of one embodiment of the stacked photovoltaic element of the second and third aspect of the present invention. The stacked photovoltaic element 800 has on the electroconductive substrate 801 of a metal or the like, the light reflection layer 802, second photovoltaic element 803, the intermediate layer 806 (consisting of the first layer 804 mainly composed of indium oxide and the second layer 805 mainly composed of zinc oxide), first photovoltaic element 807 and transparent electrode 808 stacked in this order as shown in FIG. 8. It is designed in such a way that a semiconductor which constitutes the photoactive section for the first photovoltaic element 807 has a larger band gap than a semiconductor which constitutes the photoactive section for the second photovoltaic element 803, or the photoactive section of the former is made thinner than the latter, thereby allowing the first photovoltaic element 807 to absorb light in a short wavelength range while allowing the second photovoltaic element 803 to absorb light in a long wavelength range. The intermediate layer 806 functions to reflect a part of light and thereby to increase quantity of light absorbed by the first photovoltaic element 807. The intermediate layer 806 may be provided with irregularities on the surface.

FIGS. 7A to 7D schematically outline the method of the present invention for producing the stacked photovoltaic element of the present invention as shown in FIG. 8.

Figure 7A:
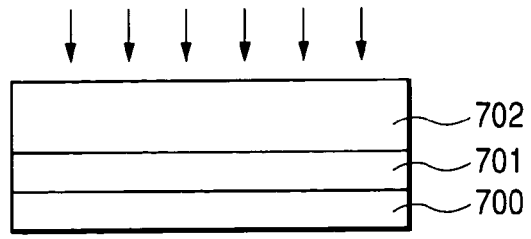
FIGS. 7A, 7B, 7C and 7D are schematic cross-sectional views showing the method of the present invention for producing a stacked photovoltaic element.
Figure 7B:
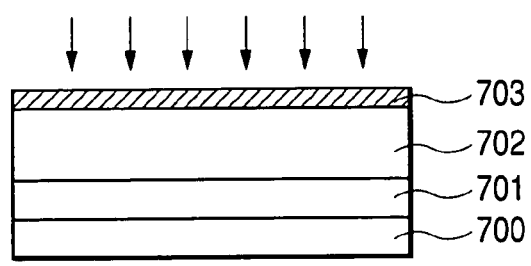
Figure 7C:
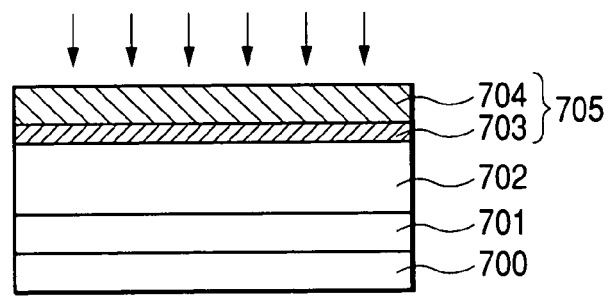
Figure 7D:
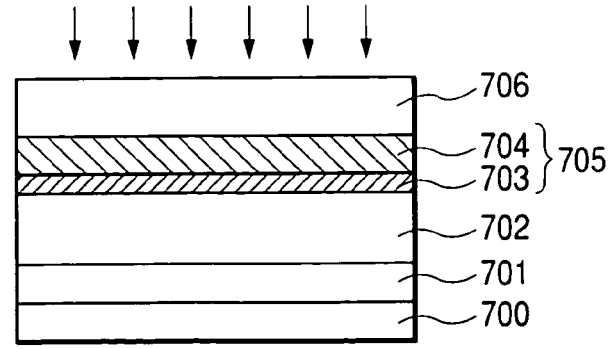

On the substrate 700 having a reflection layer 701 and second photovoltaic element 702 formed thereon as shown in FIG. 7A, a layer 703 mainly composed of indium oxide is deposited as shown in FIG. 3B. The layer 704 mainly composed of zinc oxide is deposited as shown in FIG. 3C. The first photovoltaic element 706 is further deposited thereon as shown in FIG. 7D. Then, the transparent electrode is deposited thereon. The deposition of each layer in this order complete the stacked photovoltaic element with the intermediate layer 705 (consisting of the layer 703 mainly composed of indium oxide and layer 704 mainly composed of zinc oxide) between the photovoltaic elements.

Figure 9:
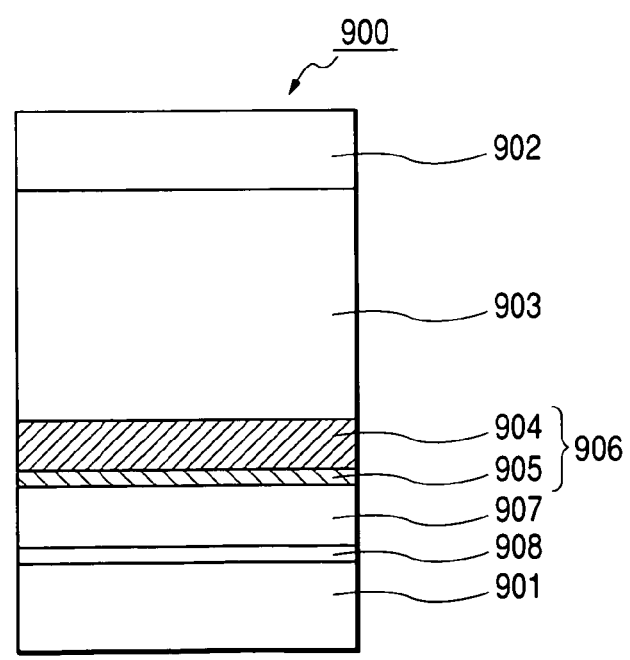
FIG. 9 is a schematic cross-sectional view showing the structure of another embodiment of the stacked photovoltaic element of the present invention.

FIG. 9 schematically outlines a cross-sectional structure of another embodiment of the stacked photovoltaic element of the present invention. The stacked photovoltaic element 900 has on the transparent, insulating substrate 901 of glass or the like, transparent electrode 908, first photovoltaic element 907, intermediate layer 906 (consisting of the first layer 904 mainly composed of indium oxide and second layer 905 mainly composed of zinc oxide), second photovoltaic element 903 and electroconductive, light reflection layer 902 stacked in this order. In this case, incident light enters the stacked photovoltaic element 900 from the transparent, insulating substrate 901 side. The intermediate layer 906 may be provided with irregularities on the surface.

Next, each component for the stacked photovoltaic element of the present invention is described.

[Substrate]

The material for the substrate which constitutes the stacked photovoltaic element of the present invention is not limited. It may be an electroconductive or insulating material of any type. The electroconductive materials include metals, e.g., plated steel, NiCr, stainless steel, Al, Cr, Mo, Au, Nb, Ta, V, Ti, Pt, Pb, Sn and an alloy thereof. The insulating materials include synthetic resins, e.g., polyester, polyethylene, polycarbonate, cellulose acetate, polypropylene, polyvinyl chloride, polyvinylidene chloride, polystyrene and polyamide; and glass, ceramics and paper. The particularly preferable materials are stainless steel as the metal substrate, and glass, ceramics and polyimide as the insulating substrate. A transparent, insulating substrate is used for the stacked photovoltaic element with incident light entering from the substrate side, and glass is suitable for the substrate.

The substrate surface may be smooth or of irregular texture with irregularities having the maximum height of 0.1 to 1.0 µm. A stainless steel substrate may have a surface of irregular texture by etching with an acidic solution.

Thickness of the substrate may be adequately set to give a desired stacked photovoltaic element by stacking the layers one on another as intended. When the stacked photovoltaic element is required to be flexible, it may be as thin as possible so long as it can sufficiently work as a support. However, it normally has a thickness of 10 µm or more in consideration of production, handling and mechanical strength.

[Reflection Layer]

The reflection layer for the stacked photovoltaic element of the present invention is made of a deposited film of a metal which has a high reflectivity of light from the visible to near-infrared ray, e.g., Ag, Al, Cu and an alloy thereof. It is suitably formed by, e.g., vacuum evaporation, sputtering or electrolytic deposition from an aqueous solution. It is preferably 10 to 5000 nm thick. It is preferably provided with irregularities on the surface for irregular reflection. It is also preferably provided with an increased reflectance layer to increase quantity of reflected light.

The materials for the increased reflectance layer include $ZnO$, $SnO_2$, $In_2O_3$, ITO, $TiO_2$, CdO, $Cd_2SnO_4$, $Bi_2O_3$, $MoO_3$ and $Na_xWO_3$. The increased reflectance layer is suitably formed by vacuum evaporation, sputtering, electrolytic deposition, CVD, spraying, spin-on, dipping or the like of the above material. Its thickness is preferably 50 nm to 10 µm, although the optimum thickness varies depending on inherent reflectivity of the material used. The increased reflectance layer is preferably provided with irregularities on the surface for increasing light scattering. For example, in the sputtering method sputtering conditions may be selected to provide irregularities based on the grain boundaries.

[Photovoltaic Layer (Unit Photovoltaic Element)]

The semiconductors useful for the stacked photovoltaic element of the present invention include single-crystalline, poly-crystalline, microcrystalline and amorphous materials of IV, III-V, II-VI, I-III-$VI_2$ groups. The IV group materials include C, Si and Ge and an alloy thereof, III-V group materials AlAs, AlSb, GaN, GaP, GaAs, GaSb, InP and InAs, II-VI group materials ZnSe, ZnS, ZnTe, CdS, CdSe, CdTe and $Cu_2S$, and I-III-$VI_2$ group materials $CuInSe_2$. Of these, silicon-based semiconductors are more preferable. The single-crystalline, poly-crystalline, microcrystalline and amorphous semiconductors are suitably used.

The photovoltaic layer for the stacked photovoltaic element of the present invention contains a pn- or pin-junction.

The stacked photovoltaic element of the present invention comprises at least two photovoltaic layers. The semiconductors for these photovoltaic layers may be the same or different material. However, in the preferable structure, a photovoltaic layer using a semiconductor which can more efficiently absorb light of shorter wavelengths and another photovoltaic layer using a semiconductor which can more efficiently absorb light of longer wavelengths are stacked in this order from the incident light side, because light of shorter wavelength is more easily absorbed.

[Zinc Oxide Layer]

The stacked photovoltaic element of the first aspect of the present invention has an intermediate layer composed of zinc oxide in at least one position between the photovoltaic layers (unit photovoltaic elements).

The zinc oxide layer for the present invention can be suitably formed by vacuum evaporation, DC magnetron sputtering, RF magnetron sputtering, electrolytic deposition, electroless plating, CVD, MOCVD, spraying, spin-on, dipping, sol-gel process or the like. The generally known dopants for adjusting its resistivity include Al, B, Ga and In. The other known dopants include tetravalent metals, e.g., Si, Ge, Ti and Zr. When a common vacuum evaporation or sputtering method is employed, zinc oxide (target or the like) may be sintered after previously adding the dopant at a desired content to zinc oxide.

The zinc oxide layer has a varying reflectivity to reflect more light having a wavelength shorter than the wavelength $\lambda m$, at which the second photovoltaic element attains the highest spectral characteristics, and to reflect less light having a wavelength longer than the wavelength $\lambda m$, in order to efficiently convert energy of incident light over an entire wavelength range. The zinc oxide layer preferably has a transmittance of 80% or more, to efficiently utilize incident light.

The zinc oxide layer for the present invention has a resistivity varying in the thickness direction to prevent deteriorated element characteristics caused by shunt, as the problem involved in the conventional layer, while keeping its function as a selective reflection film. Its resitivity is preferably $2 \times 10^0$ $\Omega$cm or more but $5 \times 10^3$ $\Omega$cm or less. The high resistivity portion of the zinc oxide layer is preferably $5 \times 10^2$ $\Omega$cm or more but $5 \times 10^3$ $\Omega$cm or less. Its thickness is preferably 0.2 to 2 μm in consideration of its reflectivity, series resistance and irregularities on the surface.

[Intermediate Layer]

The intermediate layer for the stacked photovoltaic element of the second and third aspects of the present invention comprises two layers, one being mainly composed of indium oxide and the other mainly composed of zinc oxide. The layer mainly composed of indium oxide may contain a trace quantity of another component, e.g., Mg, Zn, Sn or Sb.

The layer mainly composed of zinc oxide may contain a trace quantity of another component, e.g., Al, Sn, In, Fe, Ga, Co, Si, Ti, Ge or Sb.

The intermediate layer may contain a still another component, e.g., $SnO_2$, $TiO_2$, CdO, $Cd_2SnO_4$, $Bi_2O_3$, $MoO_3$ or $Na_xWO_3$.

The intermediate layer may be suitably formed by vacuum evaporation, sputtering, electrolytic deposition, CVD, spraying, spin-on, dipping or the like.

The intermediate layer formed may be further treated by wet etching, dry etching or the like to have irregularities on the surface. It is formed by stacking the layer mainly composed of indium oxide on the interface with the semiconductor and then the layer mainly composed of zinc oxide.

[Transparent Electrode]

The materials for the transparent electrode for the stacked photovoltaic element of the present invention include indium oxide, tin oxide, indium-tin oxide or zinc oxide. The transparent electrode is formed by sputtering, vacuum evaporation, chemical vapor deposition, ion plating, ion beam or ion beam sputtering. It may be also formed by electrolytic deposition or immersion in an aqueous solution of a metallic ion, e.g., that containing nitric, acetic or ammonia group. It preferably has a sufficient thickness to satisfy the requirements as an antireflection film.

EXAMPLES

The examples as the preferred embodiments of the present invention are described in detail by referring to the attached drawings. These embodiments describe example for a solar cell as a stacked photovoltaic element comprising two photovoltaic layers (unit photovoltaic elements), produced by stacking on a substrate, a reflection layer, a photovoltaic element of microcrystalline silicon, an intermediate layer and a photovoltaic element of amorphous silicon in this order from the substrate side. However, the present invention is by no means limited to the above structure, and the number of the photovoltaic elements may be increased as required.

Example 1

In Example 1, the stacked photovoltaic element of the first aspect of the present invention having the pin-type second photovoltaic element 302 with the i-layer of intrinsic microcrystalline Si, pin-type first photovoltaic element 305 with the i-layer of intrinsic amorphous Si:H and the intermediate layer of zinc oxide (refer to FIG. 3) was produced.

The substrate 301, 45 mm square and 0.15 mm thick, was of flat stainless steel (SUS 430), commonly referred to as BA-finished one. It was put in a commercial DC magnetron sputtering unit (not shown), which was evacuated to a pressure of $10^{-3}$ Pa or less.

Argon was blown into the unit at 30 cm$^3$/min (normal conditions) to keep pressure inside at $2 \times 10^{-1}$ Pa. A DC power of 120 W was applied to an aluminum target (diameter: 6 inches) for 90 seconds to form a thin film of aluminum with a thickness of 70 nm on the substrate, while the substrate was kept unheated. Then, a DC power of 500 W was applied to a zinc oxide target (diameter: 6 inches), after the electrical connection was changed, for 30 minutes to form the reflection layer of zinc oxide with a thickness of about 500 nm, while the substrate was heated at 200° C.

Figure 5:
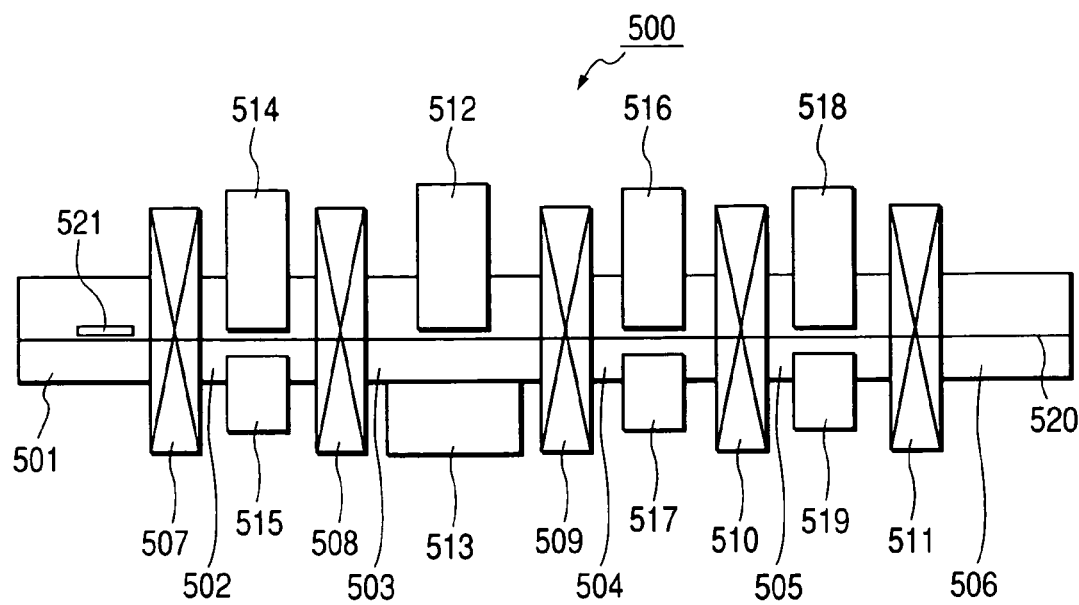
FIG. 5 is a schematic view illustrating one embodiment of a suitable apparatus for producing a semiconductor layer for the stacked photovoltaic element of the present invention.

FIG. 5 schematically illustrates one embodiment of suitable apparatus for producing a semiconductor layer for the stacked photovoltaic element of the present invention, where the deposited film forming apparatus 500 comprises the following major components; 501: load chamber, 502: RF chamber for the n-type layer, 503: chamber for the i-type layer of microcrystalline silicon, 504: RF chamber for the i-type layer of amorphous silicon, 505: RF chamber for the p-type layer and 506: unload chamber. These chambers are isolated from each other by a gate valve 507, 508, 509, 510 or 511 so that feed gases of the respective chambers are not mixed with each other.

The chamber 503 for the i-type layer of microcrystalline silicon is composed of the heater 512 for heating the substrate and plasma CVD chamber 513. The RF chamber 502 is composed of the heater 514 for depositing the n-type layer and deposition chamber 515 for depositing the n-type layer, the RF chamber 504 the heater 516 for depositing the i-type layer and deposition chamber 517 for depositing the i-type layer, and the RF chamber 505 the heater 518 for depositing the p-type layer and deposition chamber 519 for depositing the p-type layer. The substrate is supported by the substrate holder 521 to run on the rail 520 by a roller driven from an outside power source. In the plasma CVD chamber 513, a microcrystal is deposited by microwave plasma CVD or VHF plasma CVD.

The deposited film forming apparatus of the above structure was used to form, as the second photovoltaic element 302, pin-type photovoltaic element whose i-type layer was of intrinsic microcrystalline Si under the deposition conditions given in Table 1 by the following procedure.

First, the substrate 301 provided with a reflection layer was set on the substrate holder 521 and then on the rail 520 in the load chamber 501. The load chamber 501 was then evacuated to a vacuum of several hundreds mPa or less.

Next, the gate valve 507 was opened, and the substrate holder 521 was moved into the deposition chamber 515 for depositing the n-type layer in the chamber 502, where the n-type layer was deposited to a given thickness using a given feed gas, while the gate valves 507, 508, 509, 510 and 511 were kept closed. The chamber was sufficiently evacuated, and the gate valve 508 was opened to move the substrate holder 521 into the deposition chamber 503. Then the gate valve 508 was closed.

The substrate was heated to a given temperature by the heater 512, a necessary quantity of the feed gas was charged in the chamber, and given microwave or VHF energy was introduced into the deposition chamber 513 which was evacuated to a given vacuum level, to generate a plasma therein to deposit the i-type layer of microcrystalline silicon to a given thickness. The chamber 503 was sufficiently evacuated, and the gate valves 509 and 510 were opened to move the substrate holder 521 from the chamber 503 to the chamber 505.

After the substrate holder 521 was moved into the deposition chamber 519 for depositing the p-type layer in the chamber 505, the substrate was heated to a given temperature by the heater 518. A necessary quantity of the feed gas to deposit the p-type layer was charged into the deposition chamber 519 into which RF energy was introduced to deposit the p-type layer to a given thickness, while the chamber was kept at a given vacuum level.

Similarly as in the above, the deposition chamber 519 was sufficiently evacuated, and the gate valve 511 was opened to move the substrate holder 521 into the unload chamber 506. Then, all gate valves were closed and nitrogen gas was charged into the unload chamber 506, and the substrate was cooled with nitrogen gas in the unload chamber 506, while all of the gate valves were closed. Then, the substrate holder 521 was taken out of the unload chamber 506, after the discharge valve was opened.

Figure 6:
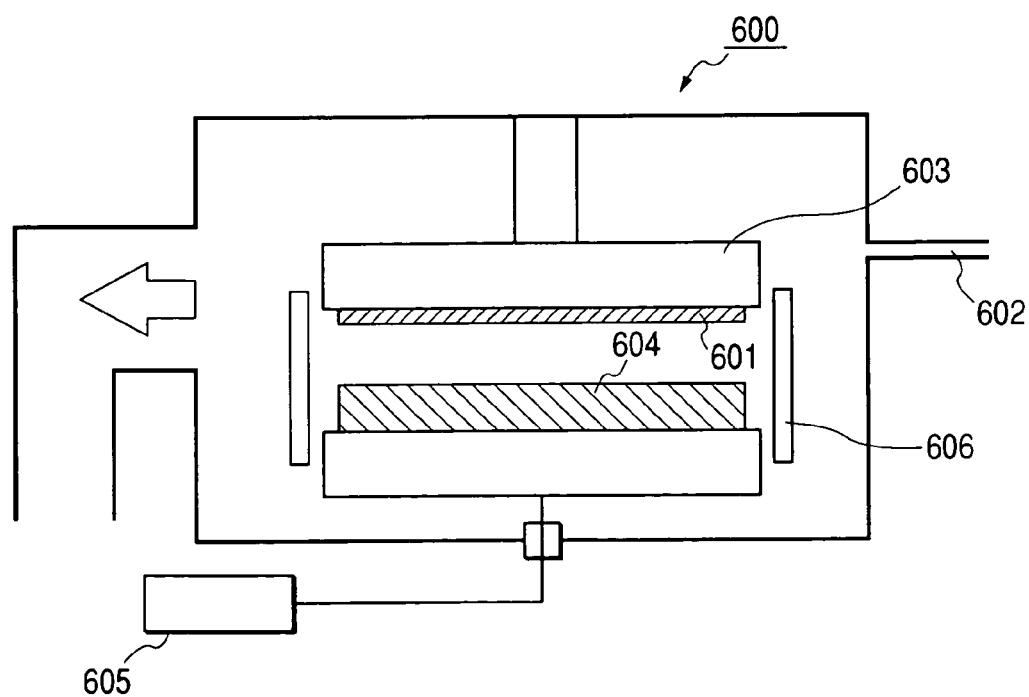
FIG. 6 is a schematic view illustrating one embodiment of a suitable apparatus for producing a zinc oxide layer for the stacked photovoltaic element of the present invention.

Next, the substrate, on which the layers up to the second photovoltaic element 302 was formed, was removed from the substrate holder 521, and set on the substrate holder 601 in the DC magnetron sputtering apparatus 600 for forming a zinc oxide layer, shown in FIG. 6. Then, the apparatus was evacuated to a pressure of $10^3$ Pa or less.

The substrate holder 601 was electrically insulated, and could keep the photovoltaic element as the sample floated. The apparatus was kept at a pressure of $2 \times 10^{-2}$ Pa while argon gas was supplied at 50 sccm, and oxygen gas and vaporized $H_2O$ gas were supplied at a rate given in Table 2 within 0.1 to 15 sccm, all via the gas inlet tube 602. The substrate holder 601 was heated by the heater 603 to keep the substrate at 150° C. A DC power of 500 W was applied from the DC power source 605 onto the Al-doped zinc oxide (ZnO) target 604 (diameter: 6 inches) for 10 minutes, to deposit the second zinc oxide layer 303 with a thickness of about 0.5 μm on the substrate. The target 604 was surrounded by the earth shield 606, to prevent diffusion of the plasma and to stabilize the discharge. At the same time, a quartz substrate (45 by 45 mm) was set on the substrate holder to deposit thereon the same layer of zinc oxide for the analysis of its electrical properties.

TABLE 2

| Sample No. | Oxygen flow rate (sccm) | $H_2O$ flow rate (sccm) |
|---|---|---|
| A | 0.1 | 10 |
| B | 0.3 | 10 |
| C | 0.4 | 10 |
| D | 0.5 | 10 |
| E | 0.8 | 10 |
| F | 1.0 | 10 |
| G | 2.0 | 5 |
| H | 5.0 | 5 |
| I | 10.0 | 2 |
| J | 15.0 | 2 |

On each of the zinc oxide layers 303, Samples A to J given in Table 2 formed on each substrate, the first zinc oxide layer 304 was deposited under the conditions of A to J as given in Table 2. A total of 100 samples were prepared. At the same time, a quartz substrate (45 by 45 mm) was set on the substrate holder to deposit thereon the same layer of zinc oxide for the analysis of its electrical properties.

Next, the deposited film forming apparatus 500 was again used to form, on a substrate on which the above intermediate layer (zinc oxide layer) was formed, as the first photovoltaic element 305, pin-type photovoltaic element whose i-type layer was of intrinsic amorphous Si:H under the deposition conditions given in Table 3 by the following procedure.

TABLE 1

| | | Gas for layer formation ($cm^3$/minute under normal conditions) | | | | Power density (W/cm$^2$) | | Pressure | Substrate temperature | Thickness of layer |
|---|---|---|---|---|---|---|---|---|---|---|
| | | SiH$_4$ | H$_2$ | PH$_3$ (diluted to 2% with H$_2$) | BF$_3$ (diluted to 2% with H$_2$) | RF | VHF | (Pa) | (°C.) | (nm) |
| Second photovoltaic element | N2 | 2 | 48 | 0.5 | | 0.04 | | 180 | 225 | 20 |
| | I2 | 25 | 750 | | | | 0.2 | 40 | 250 | 2000 |
| | P2 | 0.025 | 35 | | 1 | 1.2 | | 270 | 165 | 5 |

First, the n-type layer was deposited under given conditions to a given thickness in a manner similar to that described above. The gate valves 508 and 509 were opened and the substrate holder 521 was moved into the deposition chamber 504, after it was sufficiently evacuated. Then, these valves were closed.

The substrate was heated to a given temperature by the heater 516, and a necessary quantity of the feed gas was charged in the chamber. Given RF energy was introduced into the deposition chamber 517, which was evacuated to a given vacuum level, to generate a plasma therein to deposit the i-type layer of amorphous Si:H to a given thickness by adjusting deposition time. The chamber 504 was sufficiently evacuated, and the gate valve 510 was opened to move the substrate holder 521 from the chamber 504 to the chamber 505.

The p-type layer was deposited to a given thickness in a manner similar to that described above.

Then, the deposition chamber 519 was sufficiently evacuated, and the gate valve 511 was opened to move the substrate holder 521, which carried the substrate provided with the layers up to the first photovoltaic element 305, into the unload chamber 506 also in a manner similar to that described above.

Then, the substrate holder 521 was taken out of the unload chamber 506 also in a manner similar to that described above.

TABLE 3

| | | Gas for layer formation ($cm^3$/minute under normal conditions) | | | Power density (W/cm2) | | Pressure (Pa) | Substrate temperature (° C.) | Thickness of layer (nm) |
|---|---|---|---|---|---|---|---|---|---|
| | | $SiH_4$ | $H_2$ | $PH_3$ (diluted to 2% with $H_2$) | $BF_3$ (diluted to 2% with $H_2$) | RF | VHF | | | |
| First photovoltaic element | N1 | 2 | 48 | 0.5 | | 0.04 | | 180 | 225 | 10 |
| | I1 | 2 | 48 | | | 0.04 | | 150 | 210 | 500 |
| | P1 | 0.025 | 35 | | 1 | | 1.2 | 270 | 165 | 5 |

Next, the substrate provided with the layers up to the first photovoltaic element 305 was set on the anode surface of a DC magnetron sputtering apparatus, and masked with stainless steel. Indium/tin oxide was sputtered as the transparent electrode onto the substrate in a center area of a 40 by 40 mm using a target of mixed oxide of tin (10% by weight) and indium (90% by weight).

The oxide film was deposited to a 70 nm under the conditions of substrate temperature: 170° C., argon (as an inert gas) flow rate: 30 sccm, oxygen gas flow rate: 0.5 sccm, pressure in the deposition chamber: 300 mPa, power density on the unit target area: 0.2 W/cm$^2$ and deposition time: about 100 seconds. Thickness of the film was estimated by the predetermined relationship between thickness and deposition time. The photovoltaic element sample thus prepared was named "Ex. 1".

Comparative Example 1

A photovoltaic element was prepared in the same manner as in Example 1, except that no zinc oxide layer was placed between the first and second photovoltaic element.

(Measurement)

First, the electrical characteristics of the zinc oxide layer deposited on the quartz substrate in Example 1 were measured. Resistivity of zinc oxide varies over a wide range (10 digits), and should be evaluated by an analysis system suitable for the resistance varying values. The 2-terminal method generally used for insulators is sensitive to contact resistance, and a resistivity meter (MCP-T600 manufactured by Dian Instruments company) based on the 4-terminal method was used, where a constant current was applied by the system including 4 terminals and 4 probes connected in series to measure a potential across the terminals and thereby resistivity. The results are given in Table 4. A zinc oxide layer prepared with the target containing a higher content of dopant and smaller quantities of charged $O_2$ and $H_2O$ had a lower resistivity.

TABLE 4

| Sample No. | Resistivity ($\Omega$cm) |
|---|---|
| A | $5.0 \times 10^{-1}$ |
| B | $3.0 \times 10^0$ |
| C | $5.5 \times 10^0$ |
| D | $1.5 \times 10^1$ |
| E | $5.5 \times 10^2$ |
| F | $8.5 \times 10^2$ |
| G | $1.4 \times 10^3$ |

TABLE 4-continued

| Sample No. | Resistivity ($\Omega$cm) |
|---|---|
| H | $5.2 \times 10^3$ |
| I | $8.0 \times 10^3$ |
| J | $1.0 \times 10^4$ |

Next, a total of 101 photovoltaic element samples prepared in each of Example 1 and Comparative Example 1 were measured for the current-voltage characteristics while they were irradiated with light under the conditions of AM1.5 spectral pattern and intensity of 100 mW/cm$^2$ using an analyzer (YSS-150 manufactured by Yamashita Denso company), and their short-circuit current density Jsc (mA/cm$^2$), open voltage Voc (V) and fill factor FF were estimated based on these characteristics to determine conversion efficiency $\eta$(%).

Shunt resistance (Rsh) and series resistance (Rs) were also estimated based on the current-voltage characteristics under a dark condition, where the former was defined as slope near V=0, and the latter as slope of current when it rose up.

The results are given in Tables 5, 6, 7 and 8, respectively.

The zinc oxide layer having a higher resistivity on the second photovoltaic element side and a lower resistivity on the first photovoltaic element side can improve FF level, increase photocurrent and improve conversion efficiency for the stacked photovoltaic element by increasing reflection, reducing short-circuit current and improving the joint surface. On the other hand, the layer having a reversed combination of resistivity deteriorates in conversion efficiency as the Jsc value decreases. Moreover, the layer having the former resistivity combination exhibits excellent characteristics, when its resistivity is in a range from $2 \times 10^0$ $\Omega$cm to $5 \times 10^3$ $\Omega$cm. However, it deteriorates in conversion efficiency when its resistivity is below $2 \times 10^0$ $\Omega$cm or the high resistivity portion has $5 \times 10^2$ $\Omega$cm or less, resulting in decreased shunt resistance by short-circuit current, which in turn causes decreased FF value and then Jsc level. Resistivity exceeding $5 \times 10^3$ $\Omega$cm, on the other hand, slightly reduces the conversion efficiency, resulting from increased series resistance.

TABLE 5

| Conversion efficiency | | First zinc oxide layer | | | | | | | | | |
|---|---|---|---|---|---|---|---|---|---|---|---|
| | | A | B | C | D | E | F | G | H | I | J |
| Second zinc oxide layer | Comparative Example 1 | | | | | 0.943 | | | | | |
| | A | 0.971 | 0.969 | 0.972 | 0.973 | 0.971 | 0.981 | 0.978 | 0.977 | 0.973 | 0.972 |
| | B | 0.970 | 0.972 | 0.975 | 0.972 | 0.976 | 0.980 | 0.981 | 0.982 | 0.981 | 0.978 |
| | C | 0.985 | 0.981 | 0.982 | 0.983 | 0.981 | 0.981 | 0.982 | 0.982 | 0.982 | 0.980 |
| | D | 0.973 | 0.980 | 0.983 | 0.983 | 0.984 | 0.985 | 0.985 | 0.986 | 0.986 | 0.985 |
| | E | 0.974 | 0.982 | 1.105 | 1.053 | 1.002 | 0.988 | 0.978 | 0.980 | 0.990 | 0.986 |
| | F | 0.982 | 0.990 | 1.101 | 1.110 | 1.058 | 1.015 | 0.991 | 0.992 | 0.990 | 0.990 |
| | G | 0.985 | 0.992 | 1.102 | 1.102 | 1.169 | 1.140 | 1.011 | 0.987 | 0.991 | 0.996 |
| | H | 0.983 | 0.993 | 1.103 | 1.110 | 1.089 | 1.088 | 1.090 | 1.005 | 0.958 | 0.980 |
| | I | 0.988 | 0.990 | 0.995 | 0.996 | 0.998 | 0.992 | 0.994 | 0.993 | 0.991 | 0.990 |
| | J | 0.986 | 0.987 | 0.991 | 0.992 | 0.995 | 0.991 | 0.993 | 0.991 | 0.990 | 0.989 |

TABLE 6

| Jsc | | First zinc oxide layer | | | | | | | | | |
|---|---|---|---|---|---|---|---|---|---|---|---|
| | | A | B | C | D | E | F | G | H | I | J |
| Second zinc oxide layer | Comparative Example 1 | | | | | 0.960 | | | | | |
| | A | 0.971 | 0.969 | 0.972 | 0.973 | 0.971 | 0.981 | 0.978 | 0.977 | 0.973 | 0.972 |
| | B | 0.970 | 0.972 | 0.975 | 0.972 | 0.976 | 0.980 | 0.981 | 0.982 | 0.981 | 0.978 |
| | C | 0.985 | 0.981 | 0.982 | 0.983 | 0.981 | 0.981 | 0.982 | 0.982 | 0.982 | 0.980 |
| | D | 0.973 | 0.980 | 0.983 | 0.983 | 0.984 | 0.985 | 0.985 | 0.986 | 0.986 | 0.985 |
| | E | 0.974 | 0.982 | 1.105 | 1.053 | 1.002 | 0.988 | 0.978 | 0.980 | 0.990 | 0.986 |
| | F | 0.982 | 0.990 | 1.101 | 1.110 | 1.058 | 1.015 | 0.991 | 0.992 | 0.990 | 0.990 |
| | G | 0.985 | 0.992 | 1.102 | 1.102 | 1.169 | 1.140 | 1.011 | 0.987 | 0.991 | 0.996 |
| | H | 0.983 | 0.993 | 1.103 | 1.110 | 1.089 | 1.088 | 1.090 | 1.005 | 0.958 | 0.980 |
| | I | 0.988 | 0.990 | 0.995 | 0.996 | 0.998 | 0.992 | 0.994 | 0.993 | 0.991 | 0.990 |
| | J | 0.986 | 0.987 | 0.991 | 0.992 | 0.995 | 0.991 | 0.993 | 0.991 | 0.990 | 0.989 |

TABLE 7

| Shunt resistance | | First zinc oxide layer | | | | | | | | | |
|---|---|---|---|---|---|---|---|---|---|---|---|
| | | A | B | C | D | E | F | G | H | I | J |
| Second zinc oxide layer | A | 0.956 | 0.955 | 0.960 | 0.954 | 0.946 | 0.952 | 0.953 | 0.954 | 0.956 | 0.963 |
| | B | 0.963 | 0.972 | 0.974 | 0.978 | 0.985 | 0.989 | 0.988 | 0.987 | 0.986 | 0.990 |
| | C | 0.978 | 0.979 | 0.982 | 0.981 | 0.984 | 0.992 | 0.991 | 0.993 | 0.990 | 0.994 |
| | D | 0.985 | 0.989 | 0.990 | 0.992 | 0.991 | 0.989 | 0.992 | 0.996 | 0.993 | 0.994 |
| | E | 1.001 | 1.000 | 1.002 | 1.010 | 1.005 | 1.008 | 1.005 | 1.010 | 1.015 | 1.053 |
| | F | 0.996 | 0.999 | 1.003 | 1.002 | 1.003 | 1.010 | 1.005 | 1.015 | 1.045 | 1.060 |
| | G | 0.999 | 0.996 | 1.005 | 1.003 | 1.020 | 1.010 | 1.011 | 1.022 | 1.065 | 1.121 |
| | H | 0.999 | 1.002 | 1.004 | 1.005 | 1.009 | 1.015 | 1.019 | 1.030 | 1.089 | 1.156 |
| | I | 1.001 | 1.003 | 1.008 | 1.006 | 1.010 | 1.011 | 1.069 | 1.155 | 1.120 | 1.188 |
| | J | 1.010 | 1.011 | 1.009 | 1.010 | 1.011 | 1.023 | 1.088 | 1.145 | 1.165 | 1.190 |

TABLE 8

| Series resistance | | First zinc oxide layer | | | | | | | | | |
|---|---|---|---|---|---|---|---|---|---|---|---|
| | | A | B | C | D | E | F | G | H | I | J |
| second zinc oxide layer | A | 0.989 | 0.989 | 0.989 | 0.992 | 0.994 | 0.995 | 0.999 | 0.999 | 1.098 | 1.200 |
| | B | 0.990 | 0.991 | 0.994 | 0.999 | 0.999 | 1.001 | 1.000 | 1.002 | 1.090 | 1.201 |
| | C | 0.993 | 0.995 | 0.998 | 1.002 | 1.001 | 0.998 | 0.999 | 1.000 | 1.082 | 1.205 |
| | D | 0.996 | 0.996 | 0.999 | 0.997 | 0.989 | 0.992 | 1.001 | 1.003 | 1.102 | 1.197 |
| | E | 0.995 | 0.988 | 0.996 | 0.995 | 1.002 | 1.003 | 1.009 | 1.100 | 1.152 | 1.199 |
| | F | 0.993 | 0.991 | 0.997 | 1.020 | 1.001 | 1.005 | 1.012 | 1.120 | 1.135 | 1.140 |
| | G | 0.989 | 0.996 | 0.999 | 1.002 | 1.002 | 1.005 | 1.015 | 1.153 | 1.190 | 1.250 |
| | H | 0.989 | 0.999 | 0.999 | 1.011 | 1.010 | 1.010 | 1.015 | 1.160 | 1.203 | 1.203 |
| | I | 1.025 | 1.060 | 1.055 | 1.068 | 1.088 | 1.101 | 1.105 | 1.169 | 1.170 | 1.201 |
| | J | 1.150 | 1.155 | 1.102 | 1.100 | 1.111 | 1.056 | 1.177 | 1.188 | 1.165 | 1.250 |

In the above-described relative series resistance, a larger numeral represents a higher series resistance. The electrical properties deteriorate as series resistance increases.

Example 2

A stacked photovoltaic element was prepared in a manner similar to that for Example 1, by using a pin-type photovoltaic element 302 with the i-layer of intrinsic microcrystalline Si as the second photovoltaic element, a pin-type photovoltaic element 305 with the i-layer of intrinsic amorphous Si:H as the first photovoltaic element, and an intermediate layer of zinc oxide (refer to FIG. 3).

The zinc oxide layer sample was prepared separately from the photovoltaic element on a quartz substrate, where the same Al-containing target was used, and charge rates of oxygen gas and vaporized $H_2O$ gas were adjusted to have a varying electric conductivity (Table 9). Based on these results, the conditions were found to prepare the zinc oxide layer having resistivity gradually changing in the thickness direction of the layer, so-called graded resistivity.

TABLE 9

| Sample No. | Resistivity ($\Omega$cm) |
|---|---|
| A | $5.0 \times 10^{-1}$ |
| B | $5.0 \times 10^{0}$ |
| C | $2.5 \times 10^{1}$ |
| D | $5.5 \times 10^{1}$ |
| E | $5.5 \times 10^{3}$ |
| F | $5.0 \times 10^{3}$ |
| G | $7.5 \times 10^{3}$ |

TABLE 10

| Element No. | Resistivity range | Conversion efficiency |
|---|---|---|
| Ex. 2-1 | $5.0 \times 10^{0}$–$5.0 \times 10^{3}$ | 1.000 |
| Ex. 2-2 | $5.0 \times 10^{2}$–$5.0 \times 10^{3}$ | 1.010 |
| Ex. 2-3 | $5.0 \times 10^{0}$–$4.0 \times 10^{2}$ | 0.979 |
| Ex. 2-4 | $5.0 \times 10^{-1}$–$1.0 \times 10^{3}$ | 0.985 |
| Ex. 2-5 | $5.0 \times 10^{0}$–$7.5 \times 10^{3}$ | 0.987 |

The stacked photovoltaic element with the intermediate layer of zinc oxide was prepared in the same manner as in Example 1, except that the zinc oxide layer was prepared under the conditions given in Table 10, where these conditions were adjusted to give zinc oxide resitivity increasing from the first photovoltaic element side towards the second photovoltaic element side.

The stacked photovoltaic element samples thus prepared (Ex. 2-1 to 2-5) were evaluated in the same manner as in Example 1. The results are also given in Table 10.

It is found also in Example 2 that the zinc oxide layer having a higher resistivity on the second photovoltaic element side and a lower resistivity on the first photovoltaic element side can increase reflection, improve short-circuit current and improve the joint surface of the stacked element, to improve its FF level, photocurrent and conversion efficiency, even when resistivity increases in a graded manner.

It is also found that the effective resistivity range is $2 \times 10^{0}$ $\Omega$cm or more but $5 \times 10^{3}$ $\Omega$cm or less, and high resistivity range is $5 \times 10^{2}$ $\Omega$cm or more.

Example 3

In Example 3, the stacked photovoltaic element of the third aspect of the present invention comprising a pin-type photovoltaic element with the i-type layer of intrinsic amorphous Si:H as the first photovoltaic element, a pin-type photovoltaic element with the i-type layer of intrinsic microcrystalline Si as the second photovoltaic element, and an intermediate layer of indium/tin oxide and zinc oxide was produced as shown in FIG. 8.

Referring to FIG. 8, the substrate 801, 45 mm square and 0.15 mm thick, was of flat stainless steel (SUS 430), commonly referred to as BA-finished one. It was put in a commercial DC magnetron sputtering unit (not shown), which was evacuated to a pressure of $10^{-3}$ Pa or less.

Argon was supplied into the unit at 30 cm$^3$/min (normal conditions) to keep pressure inside at $2 \times 10^{-1}$ Pa. A DC power of 120 W was applied to an aluminum target (diameter: 6 inches) for 90 seconds to form a thin film of aluminum with a thickness of 70 nm on the substrate, while the substrate was kept unheated. Then, a DC power of 500 W was applied to a zinc oxide target (diameter: 6 inches), after the electrical connection was changed, for 30 minutes to form the increased reflectance layer of zinc oxide with a thickness of about 3000 nm on the substrate 801, while the substrate was kept at 200° C.

The deposited film forming apparatus 500, schematically illustrated in FIG. 5, was used to form the photovoltaic elements under the given deposition conditions given in Table 11.

TABLE 11

| | | Gas for layer formation (cm$^3$/minute under normal conditions) | | | | Power density (W/cm$^2$) | | Pressure | Substrate temperature | Thickness of layer |
|---|---|---|---|---|---|---|---|---|---|---|
| | | SiH$_4$ | H$_2$ | PH$_3$ (diluted to 2% with H$_2$) | BF$_3$ (diluted to 2% with H$_2$) | RF | VHF | (Pa) | (° C.) | (nm) |
| First photovoltaic element | N1 | 2 | 48 | 0.5 | | 0.04 | | 180 | 225 | 10 |
| | I1 | 25 | 48 | | | 0.04 | | 150 | 210 | 500 |
| | P1 | 0.025 | 35 | | 1 | 1.2 | | 270 | 165 | 5 |
| Second photovoltaic element | N2 | 2 | 48 | 0.5 | | 0.04 | | 180 | 225 | 20 |
| | I2 | 25 | 750 | | | | 0.2 | 40 | 250 | 2000 |
| | P2 | 0.025 | 35 | | 1 | 1.2 | | 270 | 165 | 5 |

First, the second photovoltaic element was formed on the substrate 801 under the conditions given in Table 11 by the following procedure. The substrate 801 was set on the substrate holder 521 and then on the rail 520 in the load chamber 501. The load chamber 501 was then evacuated to a vacuum of several hundreds mPa or less.

Next, the gate valve 507 was opened, and the substrate holder 521 was moved into the deposition chamber 515 for depositing the n-type layer in the chamber 502, where the n-type layer was deposited to a given thickness using a given feed gas, while the gate valves 507, 508, 509, 510 and 511 were kept closed. The chamber 502 was sufficiently evacuated, and the gate valve 508 was opened to move the substrate holder 521 into the deposition chamber 503. Then the gate valve 508 was closed.

The substrate was heated to a given temperature by the heater 512, and a necessary quantity of the feed gas was charged in the chamber. Given microwave or VHF energy was introduced into the deposition chamber 513, which was evacuated to a given vacuum level, to generate a plasma therein to deposit the i-type layer of microcrystalline silicon to a given thickness on the substrate. The chamber 503 was sufficiently evacuated, and the gate valves 509 and 510 were opened to move the substrate holder 521 from the chamber 503 to the chamber 505.

After the substrate holder 521 was moved into the deposition chamber 519 for depositing the p-type layer in the chamber 505, the substrate was heated to a given temperature by the heater 518. A necessary quantity of the feed gas to deposit the p-type layer was charged in the deposition chamber 519, in which RF energy was supplied to deposit the p-type layer to a given thickness, while the chamber was kept at a given vacuum level.

Similarly, the chamber 519 was sufficiently evacuated, and the gate valve 511 was opened to move the substrate holder 521 having the substrate 201 with a stacked photovoltaic element into the unload chamber 506.

Then, the substrate was cooled with nitrogen gas charged in the unload chamber 506, while all of the gate valves were closed. Then, the substrate holder 521 was taken out of the unload chamber 506, after the discharge valve was opened.

Next, the substrate 801, on which the layers up to the second photovoltaic element were formed, was removed from the substrate holder 521 and set in a commercial DC magnetron sputtering apparatus (not shown) in order to form the immediate layer. Then, the apparatus was evacuated to a pressure of $10^{-3}$ Pa or less.

Indium/tin oxide was sputtered onto the substrate with a mixed of tin oxide (3% by weight) and indium oxide (97% by weight) as the target.

It was deposited under the conditions of substrate temperature: 170° C., argon gas (as an inert gas) flow rate: 50 $cm^3$/minute (normal conditions), oxygen gas flow rate: 0.2 $cm^3$/minute (normal conditions) and pressure in the deposition chamber: 200 mPa, where a DC power of 10 W was applied for about 100 seconds to deposit the layer to a thickness of about 10 nm after the electrical connection was changed to the indium/tin oxide target (diameter: 6 inches). Thickness of the layer was estimated by the predetermined relationship between thickness and deposition time.

Then, the zinc oxide layer was deposited by sputtering in the same apparatus, after the target was changed to that of zinc oxide.

It was deposited under the conditions of argon gas flow rate: 30 $cm^3$/minute (normal conditions), oxygen gas flow rate: 2 $cm^3$/minute (normal conditions) and pressure in the deposition chamber: $2\times10^{-1}$ Pa, where a DC power of 100 W was applied for about 5 minutes to deposit the zinc oxide layer to a thickness of about 100 nm, after the electrical connection was changed to the zinc oxide target (diameter: 6 inches) and the substrate was heated to 120° C.

The deposited film forming apparatus 500, schematically illustrated in FIG. 5, was again used to form the pin-type photovoltaic element of amorphous Si:H as the first photovoltaic element on the substrate 801 provided with the intermediate layer by the following procedure.

The n-type layer was deposited to a given thickness under given conditions in the chamber 502 in a manner similar to that described above. The gate valves 508 and 509 were opened, after the chamber 502 was sufficiently evacuated, and the substrate holder 521 was moved into the chamber 504. Then, these valves were closed.

The substrate was heated to a given temperature by the heater 516, and a necessary quantity of the feed gas was charged in the chamber. Given RF energy was introduced into the deposition chamber 517, which was evacuated to a given vacuum level, to generate a plasma therein to deposit the i-type layer of amorphous Si:H to a given thickness. The chamber 504 was sufficiently evacuated, and the gate valve 510 was opened to move the substrate holder 521 from the chamber 504 to the chamber 505.

The p-type layer was deposited to a given thickness in the chamber 505 in a manner similar to that described above.

Similarly, the deposition chamber 519 was sufficiently evacuated, and the gate valve 511 was opened to move the substrate holder 521, which supported the substrate 801 provided with the photovoltaic element, into the unload chamber 506.

Then, the substrate holder 521 was taken out of the unload chamber 506 in a manner similar to that described above.

Next, the substrate was set on the anode surface of a DC magnetron sputtering apparatus, and masked with stainless steel. Indium/tin oxide was sputtered onto the substrate in a center area of a 40 by 40 mm from a target composed of tin oxide (10% by weight) and indium oxide (90% by weight) as the transparent electrode.

The oxide film was deposited to 70 nm under the conditions of substrate temperature: 170° C., argon (as an inert gas) flow rate: 50 $cm^3$/minute (normal conditions), oxygen gas flow rate: 0.5 $cm^3$/minute (normal conditions), pressure in the deposition chamber: 300 mPa, power density on the unit target area: 0.2 W/$cm^2$ and deposition time: about 100 seconds. Thickness of the film was estimated by the predetermined relationship between thickness and deposition time. The stacked photovoltaic element sample thus prepared was named "Ex. 3".

Comparative Example 2

Figure 12:
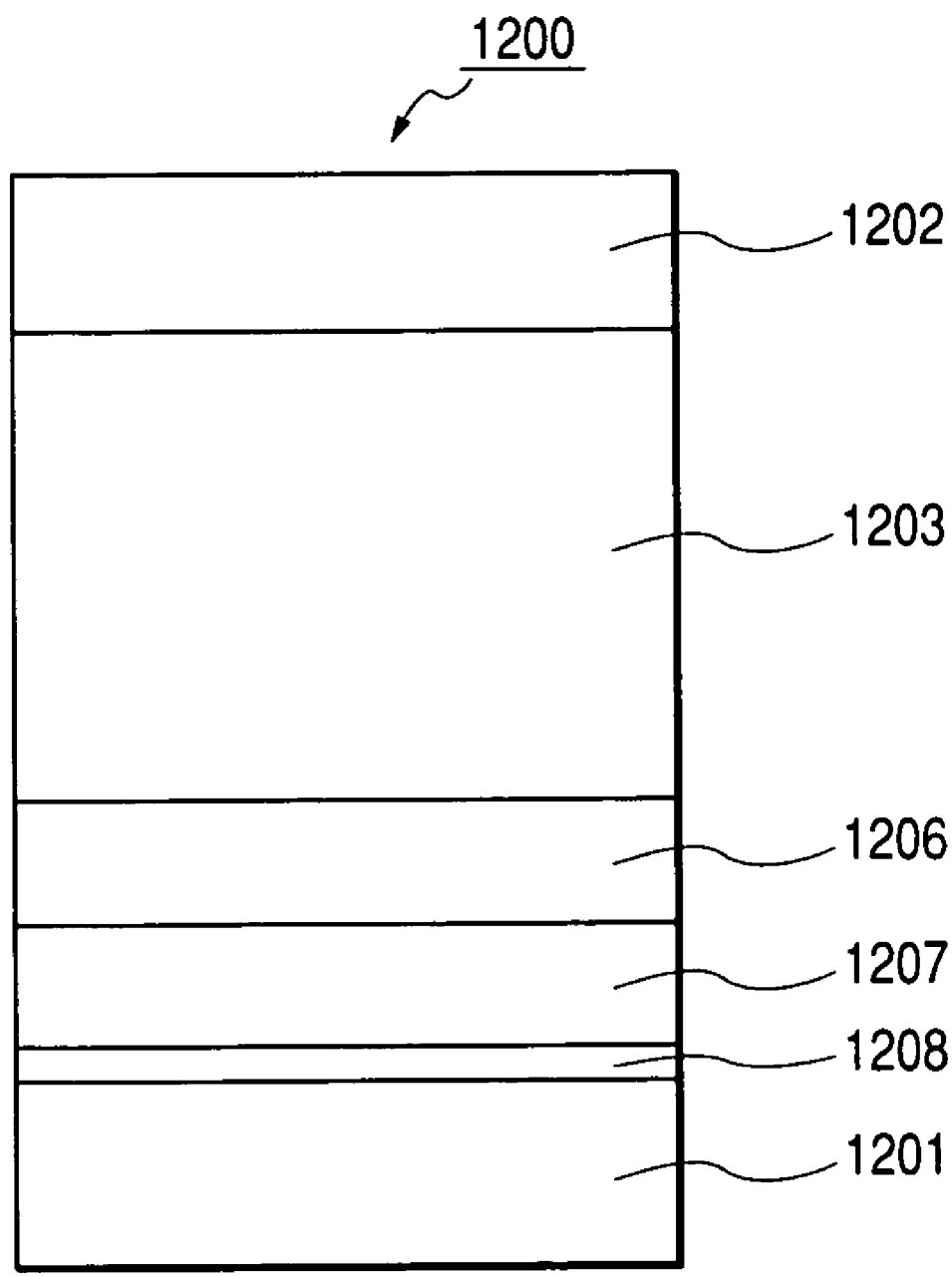
FIG. 12 is a schematic cross-sectional view showing the structure of the stacked photovoltaic element having an intermediate layer composed of one layer in Comparative Example.

The stacked photovoltaic element 1200 was prepared to have the same structure as that of the stacked photovoltaic element 800 of the present invention (FIG. 8), except that the intermediate layer 1206 was composed of only one layer as shown in FIG. 12. Referring to FIG. 12, on the electroconductive substrate 1201 of a metal or the like, the light reflection layer 1202, second photovoltaic element 1203, intermediate layer 1206, first photovoltaic element 1207 and transparent electrode 1208 were stacked in this order.

The zinc oxide layer as the intermediate layer 1206 was deposited by sputtering with a target of zinc oxide.

It was deposited under the conditions of argon gas flow rate: 30 $cm^3$/minute (normal conditions), oxygen gas flow rate: 2 $cm^3$/minute (normal conditions) and pressure in the deposition chamber: $2\times10^{-1}$ Pa, where a DC power of 100 W was applied for about 5 minutes and 30 seconds to deposit the zinc oxide layer to a thickness of about 110 nm, after the electrical connection was changed to the zinc oxide target (diameter: 6 inches) and the substrate was heated to 100° C. The stacked photovoltaic element was prepared in the same manner as in Example 3, except that the intermediate layer 1206 composed of only one layer was used. This sample was named "Compar. 2-1".

In deposition of the intermediate layer 1206, indium/tin oxide was sputtered onto the substrate using a target composed of tin oxide (3% by weight) and indium oxide (97% by weight).

The intermediate layer was deposited to about 110 nm under the conditions of substrate temperature: 170° C., argon (as an inert gas) flow rate: 50 cm$^3$/minute (normal conditions), oxygen gas flow rate: 0.2 cm$^3$/minute (normal conditions), pressure in the deposition chamber: 200 mPa, where a DC power of 10 W was applied for about 18 minutes and 20 seconds, after the electrical connection was changed to the target of indium/tin oxide (diameter: 6 inches). The stacked photovoltaic element was prepared in the same manner as in Example 3, except that the intermediate layer 1206 prepared above was used. This sample was named "Compar. 2-2".

Moreover, in preparation of the intermediate layer 806 for the stacked photovoltaic element 800 illustrated in FIG. 8, zinc oxide was sputtered first with a target of zinc oxide.

It was deposited under the conditions of argon gas flow rate: 30 cm$^3$/minute (normal conditions), oxygen gas flow rate: 2 cm$^3$/minute (normal conditions) and pressure in the deposition chamber: 2×10$^{-1}$ Pa, where a DC power of 100 W was applied for about 30 minutes to deposit the zinc oxide layer to a thickness of about 10 nm, after the electrical connection was changed to the zinc oxide target (diameter: 6 inches) and the substrate was heated to 120° C.

Then, indium/tin oxide was sputtered in the same apparatus, after the target was changed to a target composed of tin oxide (3% by weight) and indium oxide (97% by weight).

The intermediate layer was deposited to about 100 nm under the conditions of substrate temperature: 170° C., argon (as an inert gas) flow rate: 50 cm$^3$/minute (normal conditions), oxygen gas flow rate: 0.2 cm$^3$/minute (normal conditions), pressure in the deposition chamber: 200 mPa, where a DC power of 10 W was applied for about 16 minutes and 40 seconds, after the electrical connection was changed to the target of indium/tin oxide (diameter: 6 inches). The stacked photovoltaic element was prepared in the same manner as in Example 3, except that the intermediate layer prepared above was used. This sample was named "Compar. 2-3".

These samples prepared in Example 3 and Comparative Example 2 were measured for the current-voltage characteristics while they were irradiated with light under the conditions of AM1.5 spectral pattern and intensity of 100 mW/cm$^2$ using an analyzer (YSS-150 manufactured by Yamashita Denso company), and their short-circuit current density Jsc (mA/cm$^2$), open voltage Voc (V) and fill factor FF were estimated based on these characteristics to determine conversion efficiency η(%).

Shunt resistance Rsh (kΩcm$^2$) was also estimated based on the current-voltage characteristics under a dark condition from the slope at near the origin.

These results are given in Table 12 by the ratio of characteristic values of Example to those of Comparative Example (Ex. 3/Compar. 2-1, Ex. 3/Compar. 2-2 and Ex. 3/Compar. 2-3).

TABLE 12

|  | Jsc | FF | Voc | Eff. | Rsh |
| --- | --- | --- | --- | --- | --- |
| Ex. 3/Compar. 2-1 | 1.001 | 1.017 | 1.044 | 1.064 | 8.20 × 10$^{-1}$ |
| Ex. 3/Compar. 2-2 | 1.014 | 1.152 | 1.006 | 1.174 | 1.54 × 10$^2$ |
| Ex. 3/Compar. 2-3 | 1.013 | 1.156 | 1.051 | 1.231 | 9.23 × 10$^1$ |

Figure 10:
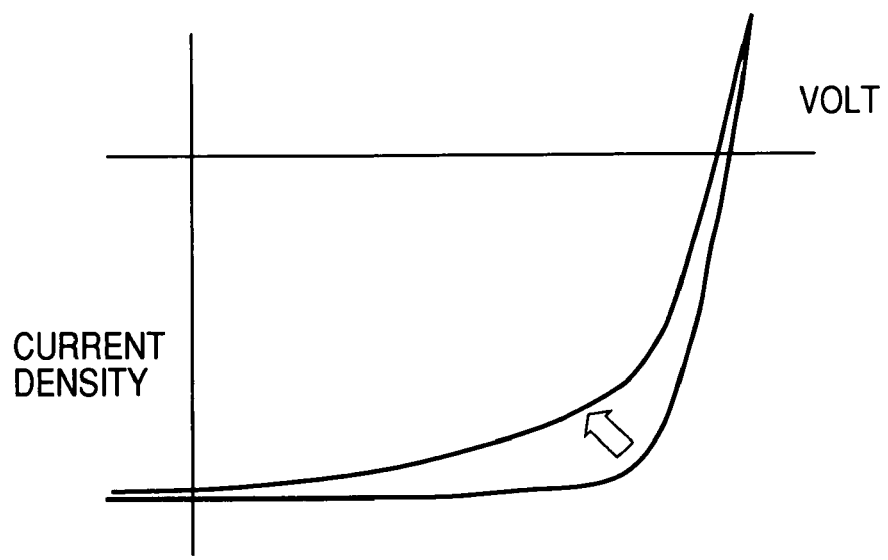
FIG. 10 shows J-V curves of the stacked photovoltaic elements prepared in Example 3 and Comparative Example 2-1.

Ex. 3 exhibited a higher conversion efficiency than Compar. 2-1 resulting from improvements both in the FF and Voc values. FIG. 10 shows JV curves of these samples. Superiority of Ex. 3 mainly resulted from the improved Voc value, conceivably indicating that Compar. 2-1 had a defective junction between the interface with the semiconductor and that with the intermediate layer.

Figure 11:
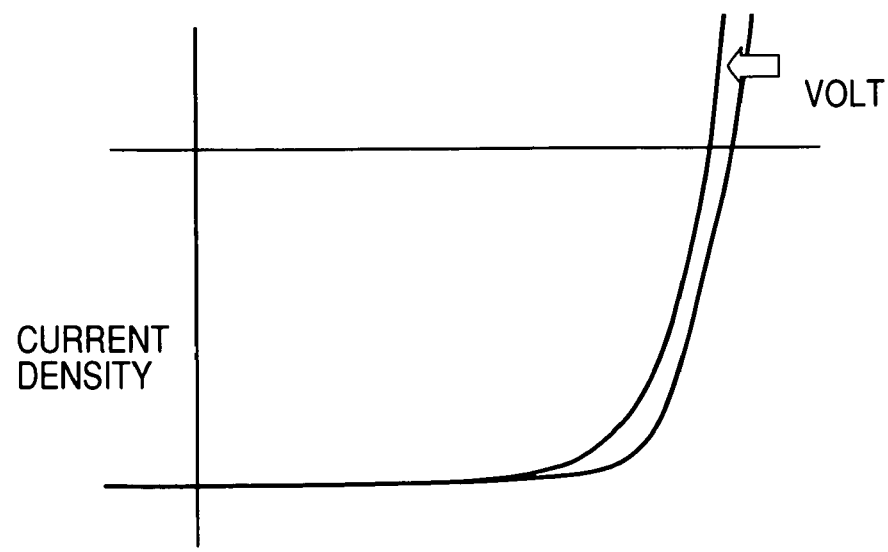
FIG. 11 shows J-V curves of the stacked photovoltaic elements prepared in Example 3 and Comparative Example 2-2.

Ex. 3 exhibited a higher conversion efficiency than Compar. 2-2 resulting from improvements in all of the FF, Voc and Rsh values. FIG. 11 shows JV curves of these samples. Superiority of Ex. 3 mainly resulted from decreased shunt resistance of Compar. 2-2, which mainly decreased the FF value.

Ex. 3 exhibited a higher conversion efficiency than Compar. 2-3 resulting from improvements in all of the FF, Voc and Rsh values. Compar. 3 was formed by depositing zinc oxide and then indium/tin oxide in this order which was reversed in Ex. 3. This order conceivably deteriorated the interfacial junction conditions and shunt resistance, which in turn caused the decreased Voc and FF values.

The reliability test was conducted by the following procedure. A reverse bias of −0.85 V was applied continuously for 20 hours to the sample kept at 85° C. and 85% RH in a high-temperature, high-humidity chamber. It was then taken out of the chamber, and naturally dried and cooled sufficiently to be analyzed for the voltage-current characteristics. The results are given in Table 13, where each of the characteristics reported is relative to the initial level.

TABLE 13

|  | Jsc | FF | Voc | Eff. | Rsh |
| --- | --- | --- | --- | --- | --- |
| Ex. 3 | 1.001 | 0.991 | 0.997 | 0.989 | 0.785 |
| Compar. 2-1 | 1.000 | 0.989 | 0.998 | 0.987 | 0.779 |
| Compar. 2-2 | 0.959 | 0.906 | 0.992 | 0.862 | 0.387 |
| Compar. 2-3 | 0.980 | 0.947 | 0.995 | 0.924 | 0.449 |

The reliability test caused essentially no decrease in shunt resistance with respect to both Ex. 3 and Compar. 2-1, whereas it decreased the value from the initial level with respect to Compar. 2-2 and 2-3, mainly resulting in the decreased Voc and FF values to cause deteriorated photoelectric conversion efficiency.

It is therefore concluded, based on the above results, that the second and third aspect of the present invention have good initial photoelectric conversion efficiency and are highly durable.

Example 4

In Example 4, the stacked photovoltaic element of the third aspect of the present invention comprising the pin-type photovoltaic element with the i-type layer of intrinsic amorphous Si:H as the first photovoltaic element, pin-type photovoltaic element with the i-type layer of intrinsic microcrystalline Si as the second photovoltaic element, and the intermediate layer of indium/tin oxide and zinc oxide, as shown in FIG. 8, was produced, where four samples of varying the thickness ratio of the indium/tin oxide layer to zinc oxide layer were prepared.

For preparation of the intermediate layer, indium/tin oxide was sputtered onto the substrate using a target composed of tin oxide (3% by weight) and indium oxide (97% by weight).

Indium/tin oxide was deposited under the conditions of substrate temperature: 170° C., argon gas (as an inert gas) flow rate: 50 cm$^3$/minute (normal conditions), oxygen gas flow rate: 0.2 cm$^3$/minute (normal conditions) and pressure in the deposition chamber: 200 mPa, where a DC power of 10 W was put for a given time to deposit the layer to a given thickness after the electrical connection was changed to the indium/tin oxide target (diameter: 6 inches).

Then, the zinc oxide layer was deposited by sputtering in the same apparatus, after the target was changed to that of zinc oxide.

Zinc oxide was deposited under the conditions of argon gas flow rate: 30 cm$^3$/minute (normal conditions), oxygen gas flow rate: 2 cm$^3$/minute (normal conditions) and pressure in the deposition chamber: $2 \times 10^{-1}$ Pa, where a DC power of 100 W was applied for a given time to deposit the layer to a given thickness, after the electrical connection was changed to the zinc oxide target (diameter: 6 inches) and the substrate was heated to 120° C. All of these intermediate layers have the same total thickness set at about 110 nm.

These stacked photovoltaic element samples were prepared in the same manner as in Example 3, except that thickness ratio of the indium/tin oxide layer to zinc oxide layer was varied. These samples were named "Ex. 4A", "Ex. 4B", "Ex. 4C" and "Ex. 4D". Table 14 summarizes the conditions under which each sample was prepared.

TABLE 14

|  | Indium tin oxide | | Zinc oxide | |
| --- | --- | --- | --- | --- |
|  | Deposition time | Thickness of layer (nm) | Deposition time | Thickness of layer (nm) |
| Ex. 4A | 1 min. 40 sec. | 10 | 5 min. | 100 |
| Ex. 4B | 7 min. 30 sec. | 45 | 3 min. 15 sec. | 65 |
| Ex. 4C | 10 min. 50 sec. | 65 | 2 min. 15 sec. | 45 |
| Ex. 4D | 16 min. 40 sec. | 100 | 30 sec. | 10 |

Next, each photovoltaic element was analyzed for its current-voltage characteristics in the same manner as in Example 3. The results are given in Table 15, where each of the characteristics is relative to that of Compar. 2-2.

TABLE 15

|  | Jsc | FF | Voc | Eff. | Rsh |
| --- | --- | --- | --- | --- | --- |
| Ex. 4A/ Compar. 2-2 | 1.014 | 1.152 | 1.006 | 1.174 | $1.54 \times 10^2$ |
| Ex. 4B/ Compar. 2-2 | 1.013 | 1.147 | 1.006 | 1.169 | $3.11 \times 10^1$ |
| Ex. 4C/ Compar. 2-2 | 1.010 | 1.078 | 1.001 | 1.090 | $1.57 \times 10^1$ |
| Ex. 4D/ Compar. 2-2 | 1.009 | 1.023 | 0.999 | 1.031 | $2.18 \times 10^0$ |

Each of Ex. 4A, Ex. 4B, Ex. 4C and Ex. 4D had better characteristics than Compar. 2-2. It was also observed that conversion efficiency increased as the thickness of the indium/tin oxide layer became smaller than that of the zinc oxide layer. The reliability test was also conducted in the same manner as in Example 3. The results are given in Table 16, where each of the characteristics reported is relative to the initial level.

TABLE 16

|  | Jsc | FF | Voc | Eff. | Rsh |
| --- | --- | --- | --- | --- | --- |
| Ex. 4A | 1.001 | 0.991 | 0.997 | 0.989 | 0.785 |
| Ex. 4B | 0.999 | 0.997 | 1.000 | 0.996 | 0.899 |
| Ex. 4C | 0.982 | 0.910 | 1.000 | 0.894 | 0.240 |
| Ex. 4D | 0.963 | 0.903 | 0.999 | 0.870 | 0.298 |
| Compar. 2-2 | 0.959 | 0.906 | 0.992 | 0.862 | 0.387 |

The reliability test results indicated that each of Ex. 4A, Ex. 4B, Ex. 4C and Ex. 4D had higher reliability than Compar. 2-2. It was also observed that reliability increased as the thickness of the indium/tin oxide layer became smaller than that of the zinc oxide layer.

To summarize these results: Ex. 4A and Ex. 4B have a higher conversion efficiency and higher reliability than Ex. 4C and Ex. 4D, and the indium/tin oxide layer is preferably thinner than the zinc oxide layer.

Example 5

In Example 5, the stacked photovoltaic element of the third aspect of the present invention comprising the pin-type photovoltaic element with the i-type layer of intrinsic amorphous Si:H as the first photovoltaic element, the pin-type photovoltaic element with the i-type layer of intrinsic microcrystalline Si as the second photovoltaic element, and the intermediate layer of indium/tin oxide and zinc oxide, as shown in FIG. 8, was produced, where five samples of varying the thickness ratio of the indium/tin oxide layer to zinc oxide layer were prepared.

For preparation of the intermediate layer, indium/tin oxide was sputtered onto the substrate using a target composed of tin oxide (3% by weight) and indium oxide (97% by weight).

Indium/tin oxide was deposited under the conditions of substrate temperature: 170° C., argon gas (as an inert gas) flow rate: 50 cm$^3$/minute (normal conditions), oxygen gas flow rate: 0.2 cm$^3$/minute (normal conditions) and pressure in the deposition chamber: 200 mPa, where a DC power of 10 W was put for a given time to deposit the layer to a given thickness after the electrical connection was changed to the indium/tin oxide target (diameter: 6 inches).

Then, the zinc oxide layer was deposited by sputtering in the same apparatus, after the target was changed to that of zinc oxide.

Zinc oxide was deposited under the conditions of argon gas flow rate: 30 cm$^3$/minute (normal conditions), oxygen gas flow rate: 2 cm$^3$/minute (normal conditions) and pressure in the deposition chamber: $2 \times 10^{-1}$ Pa, where a DC power of 100 W was applied for 5 minutes to deposit the layer to a thickness of 100 nm, after the electrical connection was changed to the zinc oxide target (diameter: 6 inches) and the substrate was heated to 120° C. These stacked photovoltaic element samples were prepared in the same manner as in Example 3, except that thickness of the indium/tin oxide layer for the intermediate layer was varied. These samples were named "Ex. 5A", "Ex. 5B", "Ex. 5C", "Ex. 5D" and "Ex. 5E". Table 17 summarizes the conditions under which each sample was prepared.

TABLE 17

| | Indium tin oxide | |
|---|---|---|
| | Deposition time | Thickness of layer (nm) |
| Ex. 5A | 1 min. 40 sec. | 10 |
| Ex. 5B | 5 sec. | 0.5 |
| Ex. 5C | 10 sec. | 1 |
| Ex. 5D | 8 min. 20 sec. | 50 |
| Ex. 5E | 10 min. 50 sec. | 65 |

Next, each photovoltaic element was analyzed for its current-voltage characteristics in the same manner as in Example 3. The results are given in Table 18, where each of the characteristics is relative to that of Compar. 2-2.

TABLE 18

| | Jsc | FF | Voc | Eff. | Rsh |
|---|---|---|---|---|---|
| Ex. 5A/Compar. 2-2 | 1.001 | 1.017 | 1.044 | 1.064 | $8.20 \times 10^{-1}$ |
| Ex. 5B/Compar. 2-2 | 1.002 | 1.006 | 1.017 | 1.025 | $9.83 \times 10^{-1}$ |
| Ex. 5C/Compar. 2-2 | 1.005 | 1.011 | 1.028 | 1.044 | $8.37 \times 10^{-1}$ |
| Ex. 5D/Compar. 2-2 | 1.008 | 1.012 | 1.040 | 1.062 | $6.90 \times 10^{-1}$ |
| Ex. 5E/Compar. 2-2 | 1.008 | 0.997 | 1.040 | 1.045 | $5.82 \times 10^{-1}$ |

Each of Ex. 5A, Ex. 5B, Ex. 5C, Ex. 5D and Ex. 5E had better characteristics than Compar. 2-2. It was also observed that the indium/tin oxide layer having a thickness in a range from 1 to 50 nm gave the stacked photovoltaic element of higher conversion efficiency. The reliability test was also conducted in the same manner as in Example 3. The results are given in Table 19, where each of the characteristics reported is relative to the initial level.

TABLE 19

| | Jsc | FF | Voc | Eff. | Rsh |
|---|---|---|---|---|---|
| Ex. 5A | 1.001 | 0.991 | 0.997 | 0.989 | 0.785 |
| Ex. 5B | 0.998 | 0.992 | 0.998 | 0.988 | 0.800 |
| Ex. 5C | 0.999 | 0.994 | 0.997 | 0.990 | 0.778 |
| Ex. 5D | 0.999 | 0.974 | 1.001 | 0.974 | 0.832 |
| Ex. 5E | 0.997 | 0.969 | 1.000 | 0.966 | 0.604 |

The reliability test results indicated that each of Ex. 5A, Ex. 5B, Ex. 5C, Ex. 5D and Ex. 5E deteriorated in these characteristics to a limited extent. The thinner indium/tin oxide layer gave the stacked photovoltaic element of higher reliability. The indium/tin oxide layer is preferably 50 nm thick or less.

To summarize these results: the indium/tin oxide layer having a thickness in a range from 1 to 50 nm gives the stacked photovoltaic element of higher conversion efficiency and reliability.

Example 6

In Example 6, the stacked photovoltaic element of the third aspect of the present invention comprising the pin-type photovoltaic element with the i-type layer of intrinsic amorphous Si:H as the first photovoltaic element, the pin-type photovoltaic element with the i-type layer of intrinsic microcrystalline Si as the second photovoltaic element and the intermediate layer of indium/tin oxide and zinc oxide as shown in FIG. 8, was produced where two samples were prepared under different conditions.

For preparation of the intermediate layer, indium/tin oxide was sputtered onto the substrate using a target composed of tin oxide (3% by weight) and indium oxide (97% by weight). Indium/tin oxide was deposited under the conditions of substrate temperature: 170° C., argon gas (as an inert gas) flow rate: 50 cm³/minute (normal conditions), oxygen gas flow rate: 0.2 cm³/minute (normal conditions) and pressure in the deposition chamber: 200 mPa, where a DC power of 10 W was applied for 8 minutes and 20 seconds to deposit the layer to a thickness of 50 nm, after the electrical connection was changed to the indium/tin oxide target (diameter: 6 inches).

Then, the zinc oxide layer was deposited by sputtering in the same apparatus, after the target was changed to that of zinc oxide.

Zinc oxide was deposited under the conditions of argon gas flow rate: 30 cm³/minute (normal conditions), oxygen gas flow rate: 2 cm³/minute (normal conditions) and pressure in the deposition chamber: $2 \times 10^{-1}$ Pa, where a DC power of 100 W was applied for 5 minutes to deposit the layer to a thickness of 100 nm, after the electrical connection was changed to the zinc oxide target (diameter: 6 inches) and the substrate was heated to 120° C. These stacked photovoltaic element samples were prepared in the same manner as in Example 3, except that thickness of the indium/tin oxide layer for the intermediate layer was varied. This sample was named "Ex. 6A".

In a similar manner, a DC power of 35 W was applied for 2 minutes and 30 seconds to deposit the layer to a thickness of 50 nm, after the electrical connection was changed to the indium/tin oxide target, and then a DC power of 30 W was put for 16 minutes and 40 seconds to deposit the zinc oxide layer to a thickness of 100 nm, after the electrical connection was changed to the zinc oxide target. This sample was named "Ex. 6B". Each sample was analyzed for its current-voltage characteristics in the same manner as in Example 3. The results are given in Table 20, where each of the characteristics is relative to that of Compar. 2-2.

TABLE 20

| | Jsc | FF | Voc | Eff. | Rsh |
|---|---|---|---|---|---|
| Ex. 6A/Compar. 2-2 | 1.020 | 1.147 | 1.002 | 1.172 | $1.29 \times 10^2$ |
| Ex. 6B/Compar. 2-2 | 1.020 | 1.133 | 0.996 | 1.151 | $1.57 \times 10^2$ |

Ex. 6A had better characteristics than Ex. 6B. The reliability test was also conducted in the same manner as in Example 3. The results are given in Table 21, where each of the characteristics reported is relative to the initial level.

TABLE 21

| | Jsc | FF | Voc | Eff. | Rsh |
|---|---|---|---|---|---|
| Ex. 6A | 0.999 | 0.974 | 1.001 | 0.974 | 0.832 |
| Ex. 6B | 0.998 | 0.978 | 0.998 | 0.974 | 0.834 |
| Compar. 2-2 | 0.959 | 0.906 | 0.992 | 0.862 | 0.387 |

Both samples produced the good results in the reliability test.

To summarize these results: a higher conversion efficiency and reliability can be realized, when the indium/tin oxide layer is deposited at a lower rate than the zinc oxide layer.

Example 7

In Example 7, the stacked photovoltaic element of the third aspect of the present invention comprising the pin-type photovoltaic element with the i-type layer of intrinsic amorphous Si:H as the first photovoltaic element, the pin-type photovoltaic element with the i-type layer of intrinsic microcrystalline Si as the second photovoltaic element, and the intermediate layer of indium/tin oxide and zinc oxide, as shown in FIG. 8, was produced where three samples were prepared under different conditions.

For preparation of the intermediate layer, indium/tin oxide was sputtered onto the substrate using a target composed of tin oxide (3% by weight) and indium oxide (97% by weight).

Indium/tin oxide was deposited under the conditions of substrate temperature: 170° C., argon gas (as an inert gas) flow rate: 50 cm$^3$/minute (normal conditions), oxygen gas flow rate: 0.2 cm$^3$/minute (normal conditions) and pressure in the deposition chamber: 200 mPa, where a DC power of 10 W was put for 8 minutes and 100 seconds to deposit the layer to a thickness of 10 nm, after the electrical connection was changed to the indium/tin oxide target (diameter: 6 inches).

Then, the zinc oxide layer was deposited by sputtering in the same apparatus, after the target was changed to that of zinc oxide.

Zinc oxide was deposited under the conditions of argon gas flow rate: 30 cm$^3$/minute (normal conditions), oxygen gas flow rate: 2 cm$^3$/minute (normal conditions) and pressure in the deposition chamber: 2×10$^{-1}$ Pa, where a DC power of 100 W was applied for 5 minutes to deposit the layer to a thickness of 100 nm, after the electrical connection was changed to the zinc oxide target (diameter: 6 inches) and the substrate was heated to 120° C. These stacked photovoltaic element samples were prepared in the same manner as in Example 3, except that thickness of the indium/tin oxide layer for the intermediate layer was varied. This sample was named "Ex. 7A".

In a similar manner, a DC power of 10 W was applied for 100 seconds to deposit the indium/tin oxide layer to a thickness of 10 nm while the substrate was kept at 120° C., after the electrical connection was changed to the indium/tin oxide target, and then a DC power of 100 W was put for 5 minutes to deposit the zinc oxide layer to a thickness of 100 nm, after the electrical connection was changed to the zinc oxide target and the substrate was heated to 170° C. This sample was named "Ex. 7B".

In a similar manner, a DC power of 10 W was applied for 100 seconds to deposit the indium/tin oxide layer to a thickness of 10 nm while the substrate was kept at 170° C., after the electrical connection was changed to the indium/tin oxide target, and then a DC power of 100 W was put for 5 minutes to deposit the zinc oxide layer to a thickness of 100 nm, after the electrical connection was changed to the zinc oxide target and the substrate was heated to 250° C. This sample was named "Ex. 7C".

Ex. 7C was visually observed to have the intermediate layer finely separated, and this was confirmed by microscopic observation.

Each sample was analyzed for its current-voltage characteristics in the same manner as in Example 3. The results are given in Table 22, where each of the characteristics is relative to that of Compar. 2-2.

TABLE 22

| | Jsc | FF | Voc | Eff. | Rsh |
|---|---|---|---|---|---|
| Ex. 7A/Compar. 2-2 | 1.014 | 1.152 | 1.006 | 1.174 | 1.54 × 10$^2$ |
| Ex. 7B/Compar. 2-2 | 1.008 | 1.143 | 1.004 | 1.156 | 1.53 × 10$^2$ |
| Ex. 7C/Compar. 2-2 | 1.005 | 1.141 | 1.001 | 1.149 | 1.30 × 10$^2$ |

Each of Ex. 7A, Ex. 7B and Ex. 7C had better characteristics than Compar. 2-2, and Ex. 7A was better than the others. The reliability test was also conducted in the same manner as in Example 3. The results are given in Table 23, where each of the characteristics reported is relative to the initial level.

TABLE 23

| | Jsc | FF | Voc | Eff. | Rsh |
|---|---|---|---|---|---|
| Ex. 7A | 1.001 | 0.991 | 0.997 | 0.989 | 0.785 |
| Ex. 7B | 0.997 | 0.992 | 0.999 | 0.988 | 0.800 |
| Ex. 7C | 1.000 | 0.980 | 0.999 | 0.978 | 0.707 |
| Compar. 2-2 | 0.959 | 0.906 | 0.992 | 0.862 | 0.387 |

Each of Ex. 7A, Ex. 7B and Ex. 7C had higher reliability than Compar. 2-2.

Ex. 7C had the finely separated intermediate layer, which, however, did not affect its reliability much. Ex. 7A had higher reliability than the others.

To summarize these results: a higher conversion efficiency and reliability can be realized, when the zinc oxide layer was deposited at a lower temperature than the indium/tin oxide layer.

What is claimed is:

1. A stacked photovoltaic element connected to an anode and a cathode, comprising
   a plurality of unit photovoltaic elements stacked together in series, each composed of a pn- or pin-junction,
   wherein a zinc oxide layer is provided between two consecutively stacked unit photovoltaic elements, and the zinc oxide layer has resistivity varying in a thickness direction thereof, and
   wherein both surfaces of the zinc oxide layer are in contact with different unit photovoltaic elements, and a resistivity of the zinc oxide layer on the surface in contact with a unit photovoltaic element away from the anode as seen from the zinc oxide layer is higher than a resistivity of the zinc oxide layer on the surface in contact with a unit photovoltaic element near the anode as seen from the zinc oxide layer.

2. The stacked photovoltaic element according to claim 1, wherein zinc oxide of the zinc oxide layer on a side of being in contact with a p-layer of the pn- or pin-junction has a higher resistivity than that on a side of being in contact with an n-layer of the pn- or pin-junction.

3. The stacked photovoltaic element according to claim 2, wherein a resistivity of the zinc oxide continuously decreases in the zinc oxide layer from a side of the zinc oxide layer in contact with the p-layer towards a side of the zinc oxide layer in contact with the n-layer.

4. The stacked photovoltaic element according to claim 1, wherein a resistivity of zinc oxide of the zinc oxide layer is 2×10$^0$ Ωcm or more but 5×10$^3$ Ωcm or less.

5. The stacked photovoltaic element according to claim 1, wherein a high resistant portion of zinc oxide of the zinc oxide layer has $5 \times 10^2$ Ωcm or more but $5 \times 10^3$ Ωcm or less.

6. The stacked photovoltaic element according to claim 1, wherein at least one of the plurality of the unit photovoltaic elements has a pin-junction comprising an i-type layer composed of amorphous Si:H.

7. The stacked photovoltaic element according to claim 1, wherein at least one of the plurality of the unit photovoltaic elements has a pin-junction comprising an i-type layer composed of microcrystalline Si.

8. The stacked photovoltaic element according to claim 1, wherein at least one of the plurality of the unit photovoltaic elements has a pin-junction comprising an i-type layer composed of single-crystalline or poly-crystalline Si.

9. A method for producing a stacked photovoltaic element comprising an intermediate layer between unit photovoltaic elements each having a pn- or pin-junction, comprising the steps of:

forming a first layer mainly composed of indium oxide on one of the unit photovoltaic elements by performing physical or chemical deposition on that unit photovoltaic element; and forming a second layer mainly composed of zinc oxide on and in direct contact with the first layer by performing deposition on the first layer of the same type, physical or chemical, as the deposition used in forming the first layer, wherein the two layers together form the intermediate layer and the second layer is formed at a rate of deposition higher than the first layer, and the second layer has a higher resistivity at a light-incident side thereof than a resistivity of the first layer at a side opposite the light-incident side.

10. A method for producing a stacked photovoltaic element comprising an intermediate layer between unit photovoltaic elements each having a pn- or pin-junction, comprising the steps of:

forming a first layer mainly composed of indium oxide on at least one of the unit photovoltaic elements by performing physical or chemical deposition on that unit photovoltaic element; and forming a second layer mainly composed of zinc oxide on and in direct contact with the first layer by performing physical or chemical deposition on the first layer, wherein the two layers together form the intermediate layer, and the second layer is formed at a temperature lower than the first layer, and the second layer has a higher resistivity at a light-incident side thereof than a resistivity of the first layer at a side opposite the light-incident side.

\* \* \* \* \*